(12) United States Patent
Takaya et al.

(10) Patent No.: US 10,748,595 B2
(45) Date of Patent: Aug. 18, 2020

(54) MAGNETIC MEMORY INCLUDING MEOMORY UNITS AND CIRCUITS FOR READING AND WRITING DATA AND MEMORY SYSTEM

(71) Applicant: Kabushiki Kaisha Toshiba, Tokyo (JP)

(72) Inventors: Satoshi Takaya, Kanagawa (JP); Kazutaka Ikegami, Tokyo (JP); Shinobu Fujita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/122,915

(22) Filed: Sep. 6, 2018

(65) Prior Publication Data

US 2019/0267066 A1     Aug. 29, 2019

(30) Foreign Application Priority Data

Feb. 28, 2018   (JP) .................................. 2018-035156

(51) Int. Cl.
*G11C 11/16*     (2006.01)
*H01L 27/22*     (2006.01)
*H01L 43/02*     (2006.01)

(52) U.S. Cl.
CPC ........ *G11C 11/1675* (2013.01); *G11C 11/161* (2013.01); *G11C 11/1659* (2013.01); *G11C 11/1673* (2013.01); *H01L 27/228* (2013.01); *H01L 43/02* (2013.01); *G11C 11/1653* (2013.01)

(58) Field of Classification Search
CPC .. G11C 11/1675; G11C 11/161; H01L 27/228
See application file for complete search history.

(56) References Cited

U.S. PATENT DOCUMENTS

| 4,486,739 | A | | 12/1984 | Franaszek et al. |
| 4,626,826 | A | * | 12/1986 | Fukuda .............. G11B 20/1426 341/58 |
| 4,677,421 | A | * | 6/1987 | Taniyama ............... G06T 9/005 341/59 |
| 6,747,891 | B2 | | 6/2004 | Hoffmann et al. |
| 7,289,371 | B2 | | 10/2007 | Ohta |
| 7,952,916 | B2 | | 5/2011 | Maeda et al. |
| 8,576,617 | B2 | | 11/2013 | Zhu et al. |
| 8,837,210 | B2 | | 9/2014 | Jefremow et al. |
| 9,165,630 | B2 | | 10/2015 | Jung et al. |

(Continued)

FOREIGN PATENT DOCUMENTS

| JP | 2006-318538 A | 11/2006 |
| JP | 2009-187631 A | 8/2009 |
| JP | 2012-133836 A | 7/2012 |

*Primary Examiner* — Mushfique Siddique
(74) *Attorney, Agent, or Firm* — Finnegan, Henderson, Farabow, Garrett & Dunner, L.L.P.

(57) ABSTRACT

According to one embodiment, a magnetic memory includes: a memory area; a first memory unit disposed in the memory area and including h first magnetoresistive effect elements arrayed on a first conductive layer; and a first circuit configured to receive i-bit first data, convert the first data into j-bit (j=h) second data, and write the second data in the first memory unit. The second data includes m first values and (j−m) second values, and m and j have a relationship given by "j/2−1≤m≤j/2+1".

18 Claims, 31 Drawing Sheets

(56) References Cited

U.S. PATENT DOCUMENTS

| | | |
|---|---|---|
| 2012/0155146 A1 | 6/2012 | Ueda et al. |
| 2013/0070520 A1* | 3/2013 | El Baraji .............. H01L 27/228 |
| | | 365/158 |
| 2018/0158525 A1* | 6/2018 | Nozaki .............. G11C 13/0064 |
| 2019/0006415 A1* | 1/2019 | Li ........................ G11C 11/1655 |
| 2019/0088302 A1* | 3/2019 | Shimomura ........ G11C 11/1675 |

* cited by examiner

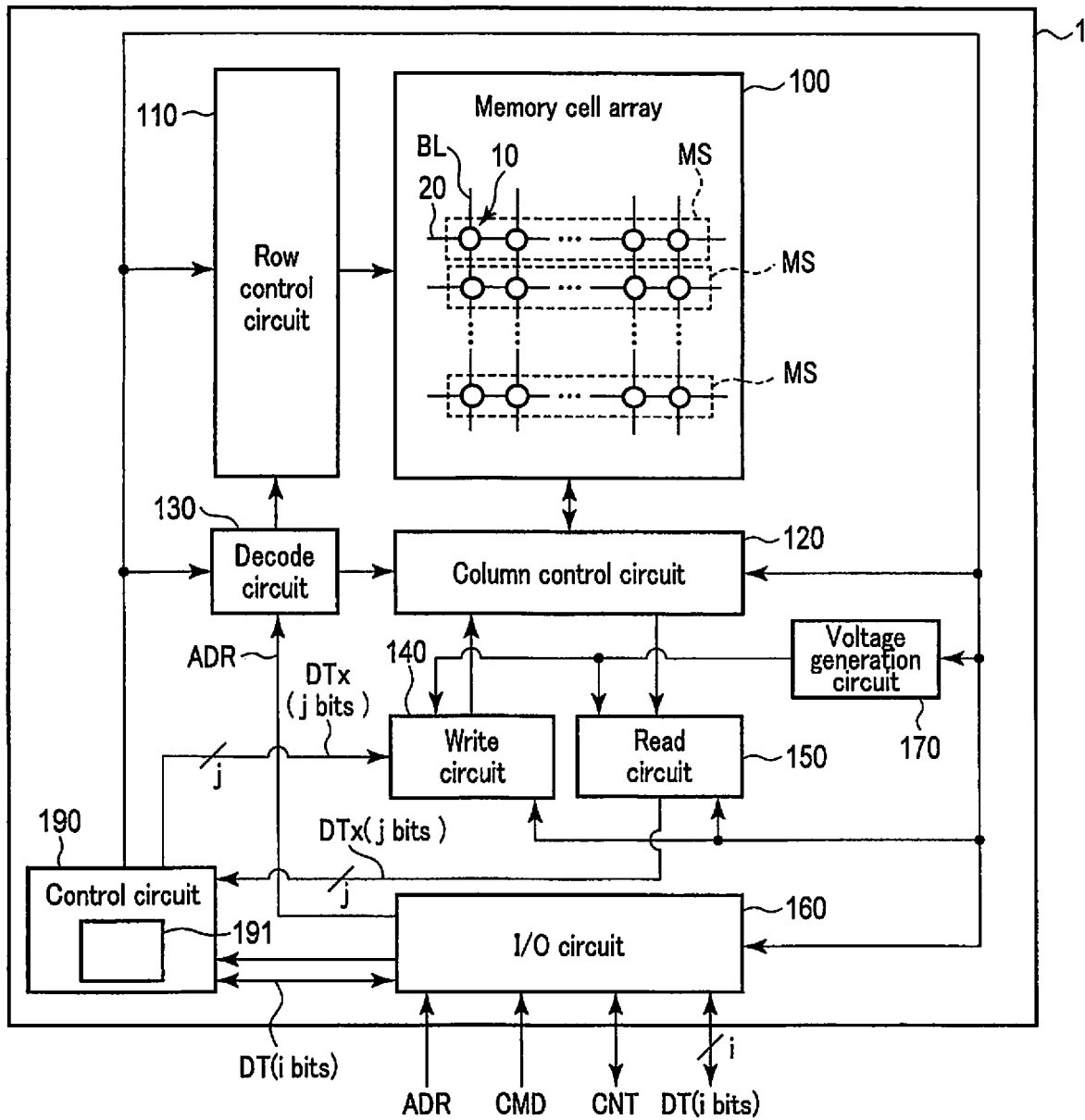
F I G. 2

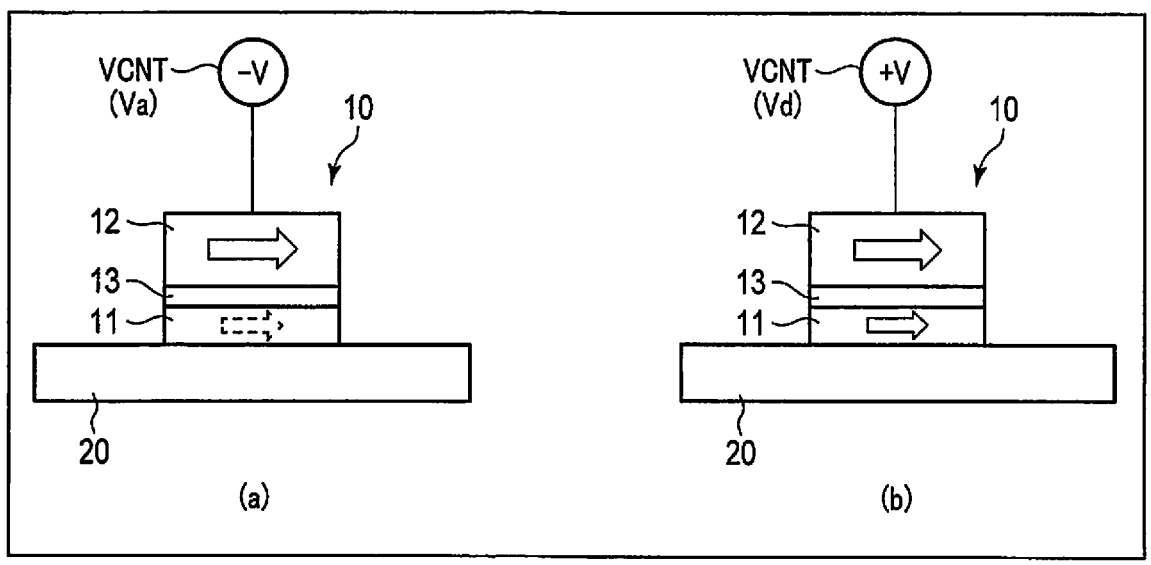
F I G. 7

| 8 bits | 10 bits |
|---|---|
| 00000000 | 1001110100 |
| 00000001 | 0111010100 |
| 00000010 | 1011010100 |
| 00000011 | 1100011011 |
| 00000100 | 1101010100 |
| 00000101 | 1010011011 |
| 00000110 | 0110011011 |
| 00000111 | 1110001011 |
| 00001000 | 1110010100 |
| 00001001 | 1001011011 |
| 00001010 | 0101011011 |
| 00001011 | 1101001011 |
| 00001100 | 0011011011 |
| 00001101 | 1011001011 |
| 00001110 | 0111001011 |
| 00001111 | 0101110100 |

| 8 bits | 10 bits |
|---|---|
| 00010000 | 0110110100 |
| 00010001 | 1000111011 |
| 00010010 | 0100111011 |
| 00010011 | 1100101011 |
| 00010100 | 0010111011 |
| 00010101 | 1010101011 |
| 00010110 | 0110101011 |
| 00010111 | 1110100100 |
| 00011000 | 1100110100 |
| 00011001 | 1001101011 |
| 00011010 | 0101101011 |
| 00011011 | 1101100100 |
| 00011100 | 0011101011 |
| 00011101 | 1011100100 |
| 00011110 | 0111100100 |
| 00011111 | 1010110100 |

...

F I G. 12

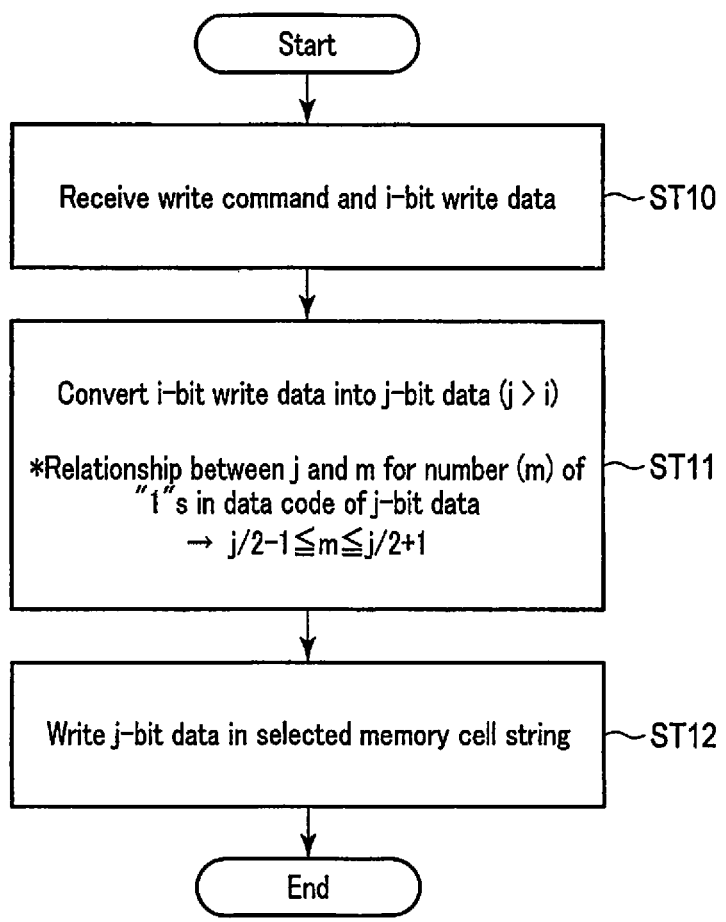
F I G. 14

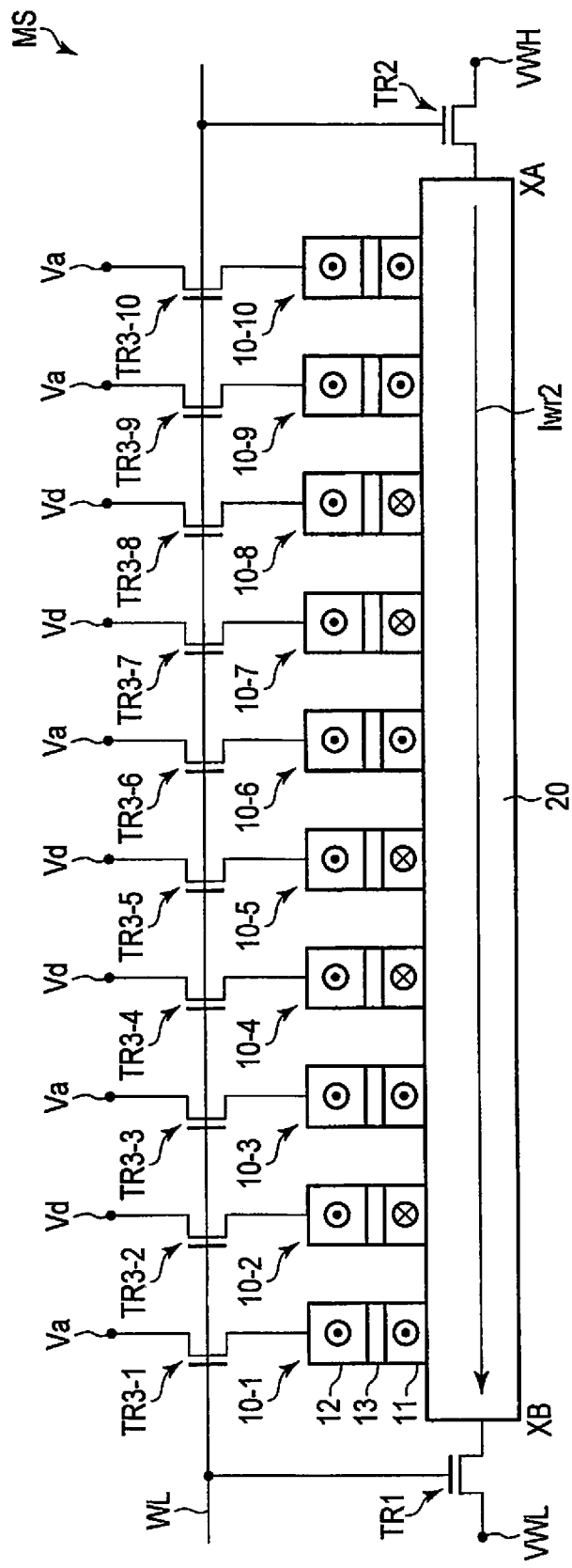
F I G. 16

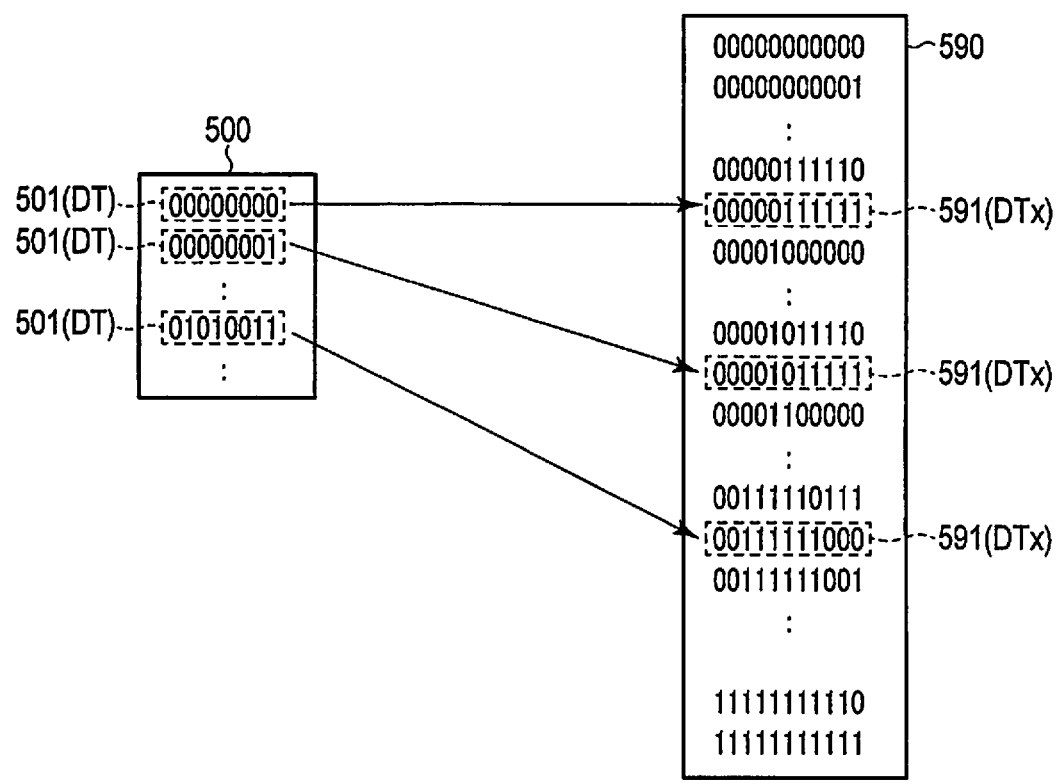
F I G. 23

| 8 bits | 11 bits |
|---|---|
| 00000000 | 00000111111 |
| 00000001 | 00001011111 |
| 00000010 | 00001101111 |
| 00000011 | 00001110111 |
| 00000100 | 00001111011 |
| 00000101 | 00001111101 |
| 00000110 | 00001111110 |
| 00000111 | 00010011111 |
| 00001000 | 00010101111 |
| 00001001 | 00010110111 |
| 00001010 | 00010111011 |
| 00001011 | 00010111101 |
| 00001100 | 00010111110 |
| 00001101 | 00011001111 |
| 00001110 | 00011010111 |
| 00001111 | 00011011011 |

| 8 bits | 11 bits |
|---|---|
| 00010000 | 00011011101 |
| 00010001 | 00011011110 |
| 00010010 | 00001100111 |
| 00010011 | 00011101011 |
| 00010100 | 00011101101 |
| 00010101 | 00011101110 |
| 00010110 | 00011110011 |
| 00010111 | 00011110101 |
| 00011000 | 00011110110 |
| 00011001 | 00011111001 |
| 00011010 | 00011111010 |
| 00011011 | 00011111100 |
| 00011100 | 00100011111 |
| 00011101 | 00100101111 |
| 00011110 | 00100110111 |
| 00011111 | 00100111011 |

...

F I G. 24

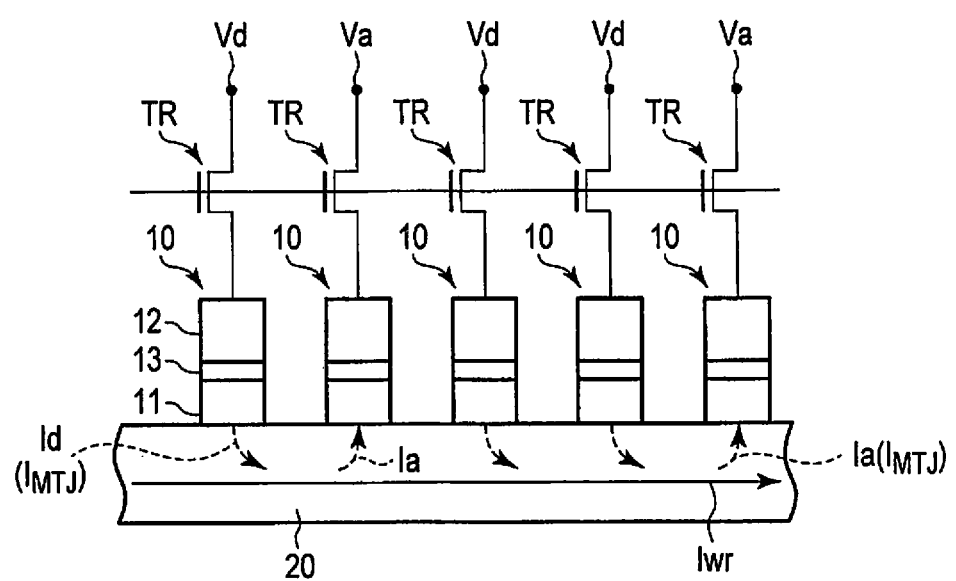
F I G. 27

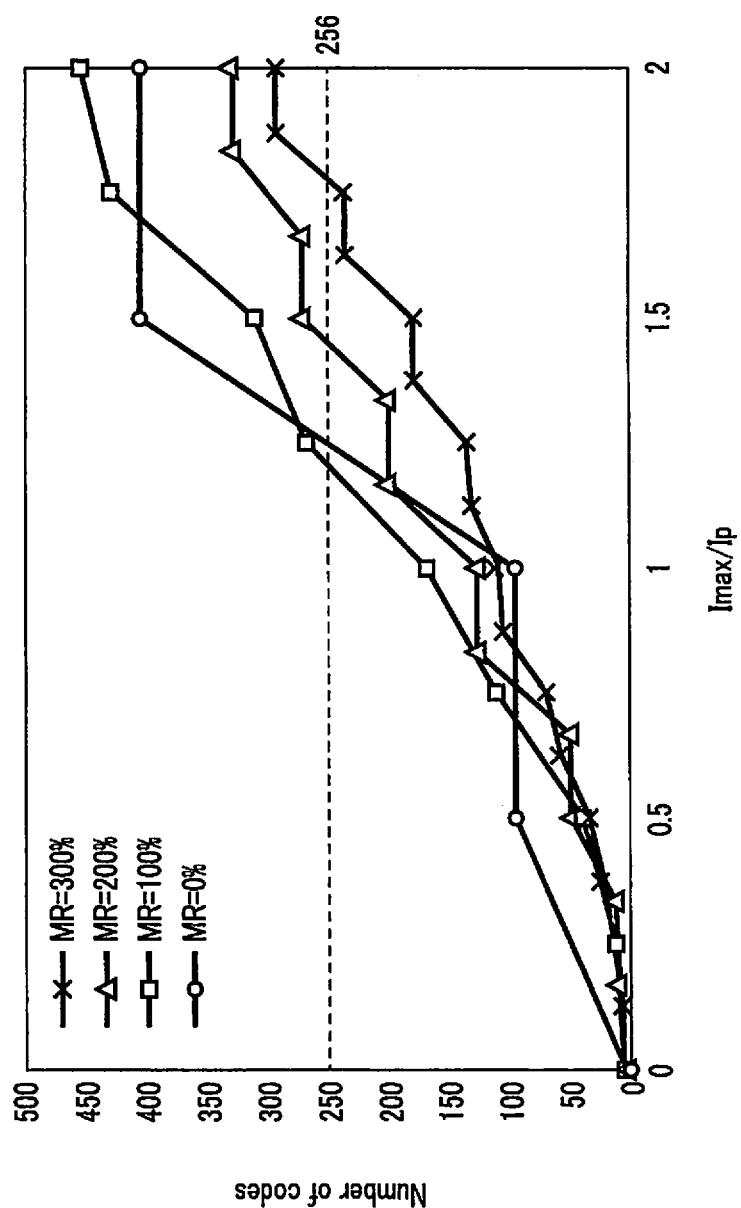
F I G. 28

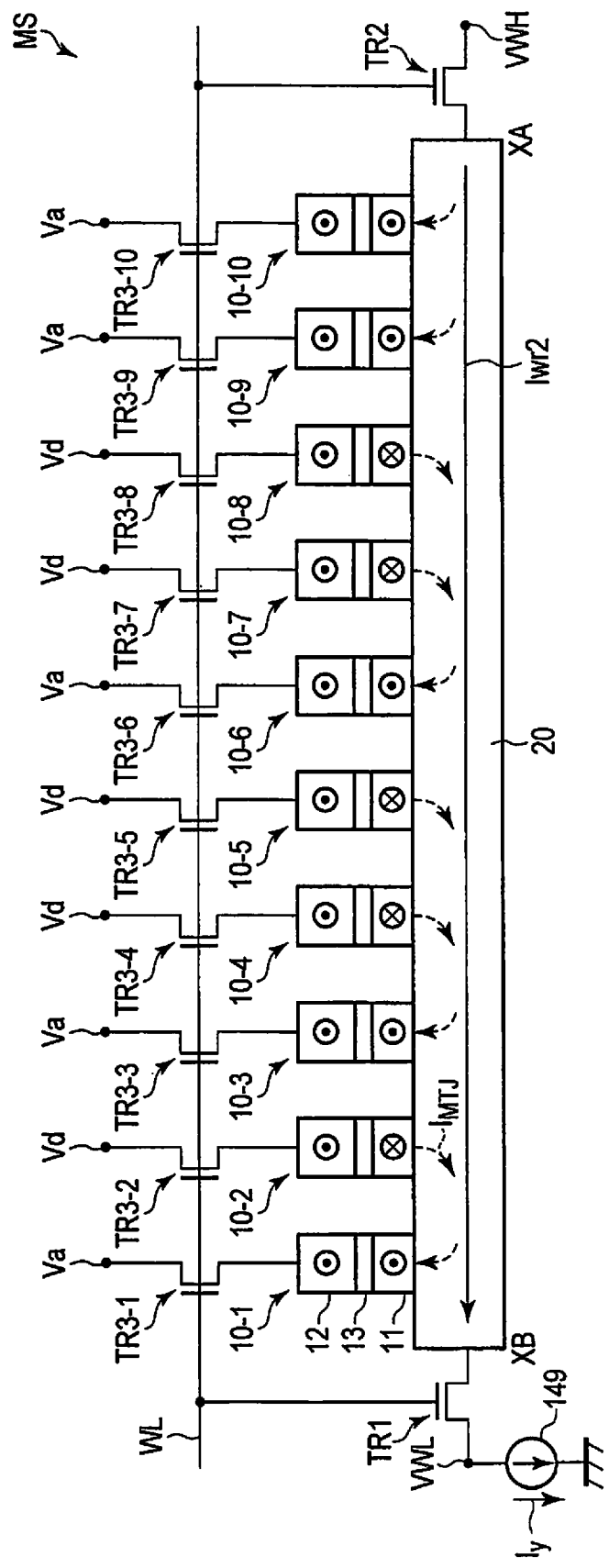
F I G. 31

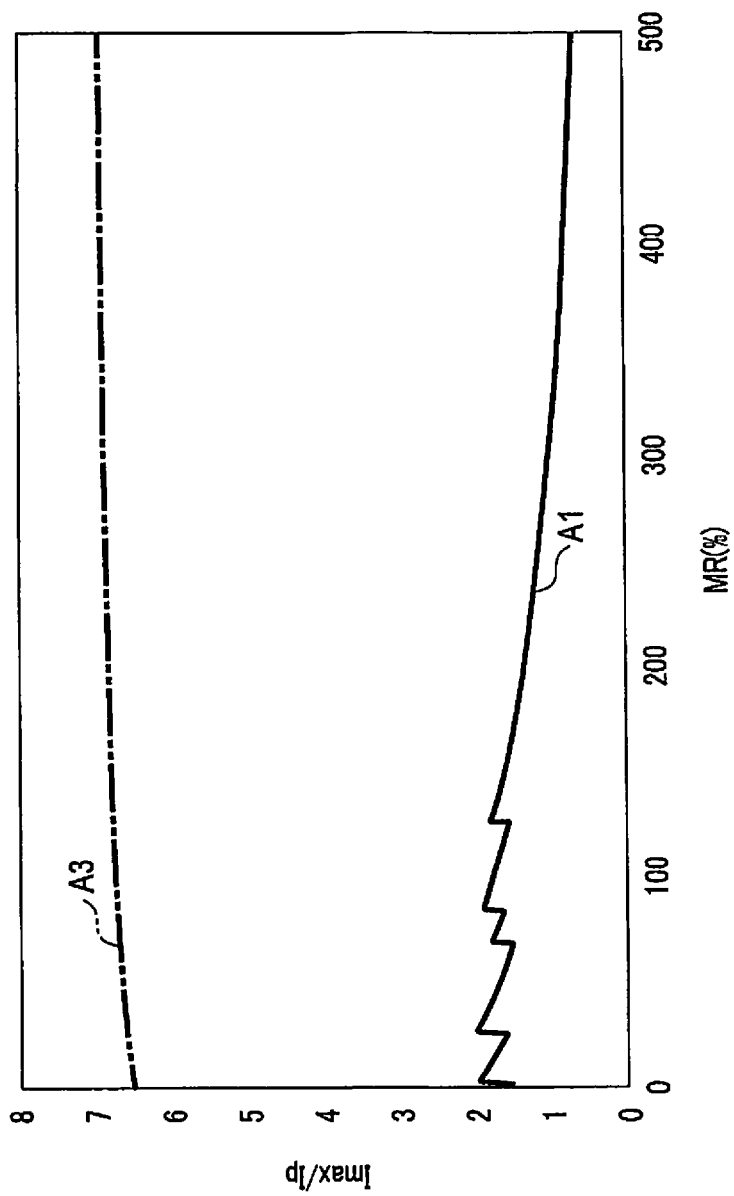
F I G. 32

MAGNETIC MEMORY INCLUDING MEOMORY UNITS AND CIRCUITS FOR READING AND WRITING DATA AND MEMORY SYSTEM

CROSS-REFERENCE TO RELATED APPLICATIONS

This application is based upon and claims the benefit of priority from Japanese Patent Application No. 2018-035156, filed Feb. 28, 2018, the entire contents of which are incorporated herein by reference.

FIELD

Embodiments described herein relate generally to a magnetic memory and a memory system.

BACKGROUND

A memory device using a magnetoresistive effect element as a memory element is under development and study.

BRIEF DESCRIPTION OF THE DRAWINGS

FIGS. 2 and 3 are views for explaining an example of the configuration of the magnetic memory according to the first embodiment;

FIGS. 4, 5, 6, 7, 8, 9, 10, 11, 12, and 13 are schematic views for explaining the magnetic memory according to the first embodiment;

FIG. 14 is a flowchart illustrating an example of the operation of the magnetic memory according to the first embodiment;

FIGS. 15, 16, and 17 are schematic views for explaining an example of the operation of the magnetic memory according to the first embodiment;

FIGS. 23, 24, 25, and 26 are schematic views for explaining the magnetic memory according to the fourth embodiment.

FIGS. 27, 28, 29, 30, 31 and 32 are schematic views for explaining a magnetic memory according to the fifth embodiment.

DETAILED DESCRIPTION

Figure 1:
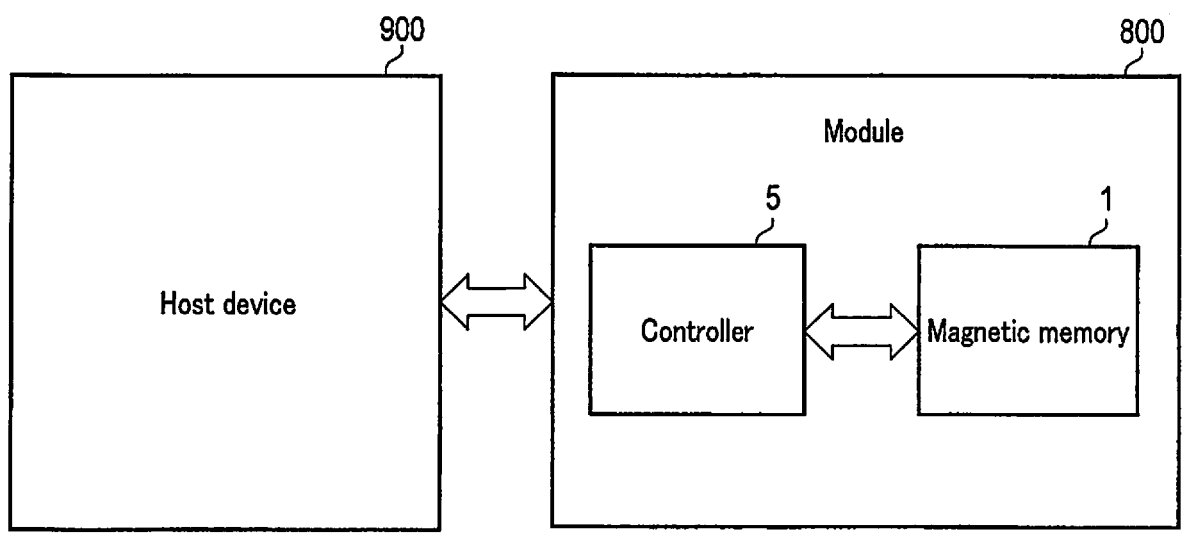
FIG. 1 is a block diagram showing an example of the configuration of a system including a magnetic memory according to the first embodiment.

Embodiments will be described in detail below with reference to the accompanying drawings. In the following description, the same reference numerals denote constituent elements having the same functions and configurations.

In the following embodiments, when constituent elements (for example, word lines WL, bit lines BL, various voltages and signals, and the like) denoted by reference numerals having numbers/alphabets as suffixes to be distinguished are not distinguished, reference numeral obtained by omitting these numbers/alphabets as the suffixes are used.

In general, according to one embodiment, a magnetic memory includes: a memory area; a first memory unit disposed in the memory area and including h first magnetoresistive effect elements arrayed on a first conductive layer; and a first circuit configured to receive i-bit first data, convert the first data into j-bit (j=h) second data, and write the second data in the first memory unit. The second data includes m first values and (j-m) second values, and m and j have a relationship given by "$j/2-1 \leq m \leq j/2+1$".

EMBODIMENTS

Magnetic memories and control methods therefor according to the embodiments will be described with reference to FIGS. 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31 and 32.

(1) First Embodiment

A magnetic memory and a control method therefore according to the first embodiment will be described with reference to FIGS. 1, 2, 3, 4, 5, 6, 7, 8, 9, 10, 11, 12, 13, 14, 15, 16, and 17.

(a) Configuration

The overall configuration of the magnetic memory according to this embodiment will be described with reference to FIGS. 1, 2, 3, and 4.

FIG. 1 is a block diagram showing an example of a system including the magnetic memory according to this embodiment.

As shown in FIG. 1, the system includes, for example, a magnetic memory 1 according to this embodiment, a controller 5, and a host device 900.

The host device 900 can request, via the controller 5, the magnetic memory 1 to perform various operations such as a data write (storage) operation, data read operation, and data erase operation.

The magnetic memory (memory device) 1 according to this embodiment includes magnetoresistive effect elements as memory elements.

The magnetic memory (to be also referred to as a spin memory hereinafter) 1 is directly or indirectly connected to the controller 5. For example, the magnetic memory 1 is a storage class memory, a main memory, or a cache memory.

The controller 5 is directly or indirectly coupled to the host device 900 via a connection terminal, a connector, a bus, or a cable.

The controller 5 can control the operation of the magnetic memory 1. The controller 5 includes a processing circuit, an internal memory, and an ECC circuit.

The controller 5 generates a command based on a request from the host device 900. The controller 5 transmits the generated command to the magnetic memory 1.

The magnetic memory 1 executes an operation corresponding to the command received from the controller 5.

For example, if the request from the host device 900 is a data write request, the controller 5 transmits a write command to the magnetic memory. Together with the write command, the controller 5 transmits a write target address, data to be written in the magnetic memory, and a control signal. Based on the write command and the control signal, the magnetic memory 1 writes, in the selected address, the data to be written.

For example, if the request from the host device 900 is a data read request, the controller 5 transmits a read command to the magnetic memory. Together with the read command, the controller 5 transmits an address of a memory cell to be selected, and a control signal. The magnetic memory 1 reads data from the selected address based on the read command and the control signal. The magnetic memory 1 transmits the read data to the controller 5. The controller 5 receives the data from the magnetic memory 1. The controller 5 transmits, to the host device 900, the data received from the magnetic memory 1.

Thus, the magnetic memory 1 executes a predetermined operation in the memory system by the request/command and control from the other devices 900 and 5.

For example, the magnetic memory 1 and the controller 5 are provided in a module (for example, a memory module) 800. The host device 900 is electrically coupled to the memory module 800. The host device 900 is at least one device selected from a portable terminal, a smartphone, a game device, a processor, a server, a personal computer, and the like.

At least one of the controller 5 and the host device 900 will be referred to as an external device hereinafter.

Note that the magnetic memory 1 according to this embodiment may be a memory in the controller 5 or the host device 900. In this case, the magnetic memory 1 is controlled by a CPU (processing circuit) in the controller 5 or a CPU (or controller) in the host device 900. In this embodiment, the controller 5 may be provided in the host device 900. The memory module 800 may be provided in the host device 900.

FIG. 2 is a block diagram showing the internal configuration of the magnetic memory according to this embodiment.

As shown in FIG. 2, the magnetic memory 1 according to this embodiment includes a memory cell array 100, a row control circuit 110, a column control circuit 120, a decode circuit 130, a write circuit 140, a read circuit 150, an I/O circuit 160, a voltage generation circuit 170, and a control circuit 190.

The memory cell array (to be also referred to as a memory area hereinafter) 100 includes a plurality of memory cell strings (control units or selection units) MS. In this embodiment and other embodiments (to be described later), the memory cell strings form a memory unit.

Each memory cell string MS includes a plurality of memory elements (to be also referred to as memory cells hereinafter) 10. In the memory cell string MS, the plurality of memory elements 10 are connected to a common conductive layer (to be also referred to as an electrode or interconnect hereinafter) 20. In the memory cell string MS, the plurality of memory elements 10 are connected to, for example, different bit lines BL. In this embodiment, the memory elements 10 are magnetoresistive effect elements.

A detailed configuration of the memory cell string MS will be described later.

The row control circuit 110 controls a plurality of rows of the memory cell array 100. A decoding result (row address) of the address is supplied from the decode circuit 130 to the row control circuit 110. The row control circuit 110 sets, in a selected state, a row (for example, at least one word line) based on the decoding result of the address. The row (word line) set in the selected state will be referred to as a selected row (selected word line) hereinafter. The rows other than the selected row will be referred to as unselected rows (unselected word lines) hereinafter.

The column control circuit 120 controls a plurality of columns of the memory cell array 100. A decoding result (column address) of the address is supplied from the decode circuit 130 to the column control circuit 120. The column control circuit 120 sets, in a selected state, a column (for example, at least one bit line BL) based on the decoding result of the address. The column (bit line) set in the selected state will be referred to as a selected column (selected bit line) hereinafter. The columns other than the selected column will be referred to as unselected columns (unselected bit lines) hereinafter.

The decode circuit 130 decodes an address ADR from the I/O circuit 160. The decode circuit 130 supplies a decoding result of the address ADR to the row control circuit 110 and the column control circuit 120. The address (for example, a physical address) ADR includes a column address to be selected and a row address to be selected.

The write circuit (to be also referred to as a write control circuit or a write driver hereinafter) 140 performs various control operations for a write operation (write of data). The write circuit 140 supplies a write current to the memory cell string MS at the time of the write operation, thereby writing data in the memory element 10.

For example, the write circuit 140 includes a voltage source (or a current source) and a latch circuit.

The read circuit (to be also referred to as a read control circuit or a read driver hereinafter) 150 performs various control operations for a read operation (read of data). The read circuit 150 controls the potential or current value of the bit line BL at the time of the read operation, thereby reading data from the memory element 10.

For example, the read circuit 150 includes a voltage source (or a current source), a latch circuit, and a sense amplifier circuit.

Note that the write circuit 140 and the read circuit 150 are not limited to circuits independent of each other. For example, the write circuit and the read circuit may include a mutually usable common constituent element (for example, a current source/voltage source), and may be provided as one integrated circuit in the magnetic memory.

The I/O circuit (input/output circuit) 160 is an interface circuit used to transmit/receive various signals in the magnetic memory 1.

The I/O circuit 160 transmits (outputs)/receives (inputs) i-bit data DT.

At the time of the write operation, the I/O circuit 160 transmits, as write data, to the control circuit 190, the data DT from the external device (for example, the controller 5). At the time of the read operation, the I/O circuit 160 transmits, as read data, to the external device, data read from the memory cell array 100 into the control circuit 190.

The I/O circuit 160 transfers, to the decode circuit 130, the address ADR from the external device. The I/O circuit 160 transfers, to the control circuit 190, a command CMD from the external device. The I/O circuit 160 transmits/receives a control signal CNT between the control circuit 190 and the external device.

The voltage generation circuit 170 generates voltages for various operations of the memory cell array 100 using a power supply voltage provided from the external device.

At the time of the write operation, the voltage generation circuit 170 outputs various voltages generated for the write operation to the write circuit 140. At the time of the read operation, the voltage generation circuit 170 outputs, to the read circuit 150, various voltages generated for the read operation.

The control circuit (to be also referred to as a state machine, a sequencer, or an internal controller hereinafter)

190 controls the operation of each circuit in the magnetic memory 1 based on the control signal CNT and the command CMD.

For example, the command CMD is a signal indicating an operation to be executed by the magnetic memory 1. For example, the control signal CNT is a signal for controlling an operation timing between the external device 5 or 900 and the magnetic memory 1, and an internal operation timing of the magnetic memory 1.

In this embodiment, the control circuit 190 is configured to convert the i-bit data DT into j-bit data DTx. The control circuit 190 is configured to convert the j-bit data DTx into i-bit data. "i" is an natural number larger than 0. "j" is an natural number larger than "i".

At the time of the write operation of the magnetic memory 1 according to this embodiment, the control circuit 190 converts the i-bit data DT from the I/O circuit 160 into the j-bit data DTx. The control circuit 190 transmits the converted data DTx to the write circuit 140. The write circuit 140 writes the j-bit data DTx in the memory cell string MS in the memory cell array 100.

As described above, in this embodiment, the i-bit write data DT from the external device is converted into j-bit data DTx, and stored (programmed) in the memory cell array 100.

At the time of the read operation of the magnetic memory 1 according to this embodiment, the read circuit 150 reads the j-bit data DTx from the selected memory cell string MS. The read circuit 150 transmits the read data DTx to the control circuit 190.

The control circuit 190 converts the j-bit data DTx from the read circuit 150 into the i-bit data DT.

The control circuit 190 transmits the converted i-bit data DT to the I/O circuit 160. The I/O circuit 160 transmits, to the external device 5 or 900, the i-bit data DT from the control circuit 190.

As described above, according to this embodiment, the j-bit data DTx in the memory cell array 100 is converted into the i-bit read data DT, and read outside the magnetic memory 1.

For example, the control circuit 190 includes a circuit 191 for data conversion between the i-bit data DT and the j-bit data DTx. The circuit (to be also referred to as a data conversion circuit hereinafter) 191 is a circuit that holds a table for conversion (and inversion) of data or a circuit that executes calculation (for example, a logical operation) for data conversion.

The magnetic memory according to this embodiment is, for example, an MRAM (or spin-RAM).

<Example of Configuration of Memory Cell String>

The internal configuration of the memory cell string of the MRAM according to this embodiment will be described with reference to FIGS. 3 and 4.

Figure 3:
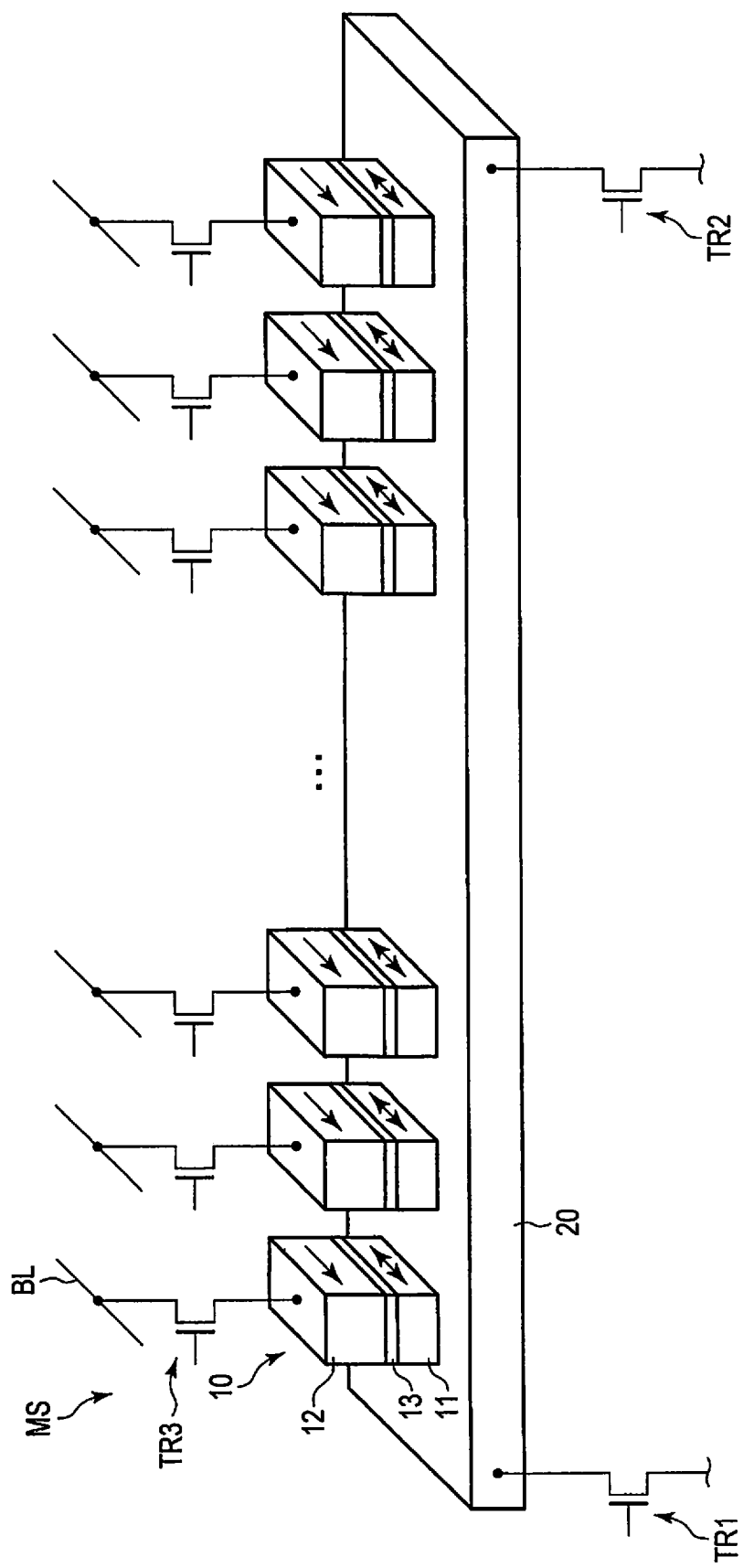

FIG. 3 is a bird's eye view for explaining the basic configuration of the memory cell string of the MRAM according to this embodiment.

As shown in FIG. 3, the memory cell string MS includes the plurality (h) of magnetoresistive effect elements 10 arrayed on the conductive layer 20. The plurality of magnetoresistive effect elements 10 are electrically connected to the common conductive layer 20. The conductive layer 20 will be also referred to as the common conductive layer 20 hereinafter.

Each magnetoresistive effect element 10 includes two magnetic layers 11 and 12 and a non-magnetic layer 13.

Each of the two magnetic layers 11 and 12 has magnetization. The direction of the magnetization of the magnetic layer 11 is variable. The direction of the magnetization of the magnetic layer 12 is invariable (in a fixed state).

In this embodiment, the magnetic layer 11 whose magnetization direction is variable will be referred to as a storage layer 11 hereinafter, and the magnetic layer 12 whose magnetization direction is invariable will be referred to as a reference layer 12 hereinafter. Note that the magnetic layer 11 may be also called a free layer or magnetization free layer. The magnetic layer 12 may be also called a fixed layer, a pin layer, a pinned layer, or a magnetization invariable layer.

In this embodiment, "the magnetization direction of the reference layer is invariable" or "the magnetization direction of the reference layer is in a fixed state (for example, is fixed)" means that when a current or a voltage (spin torque caused by a current/voltage) for changing the magnetization direction of the storage layer is supplied to the memory cell string (MTJ element), the magnetization direction of the reference layer remains unchanged by the supplied current or voltage before and after the supply of the current or voltage.

For example, each of the magnetic layers 11 and 12 has in-plane magnetic anisotropy (parallel magnetic anisotropy). The direction of easy axis of magnetization of each of the magnetic layers 11 and 12 is parallel to its layer surface. The direction of easy axis of magnetization of each the magnetic layers 11 and 12 is perpendicular to a stacking direction of the magnetic layers 11 and 12. For example, the direction of easy axis of magnetization of each of the magnetic layers 11 and 12 is set to a direction crossing the array direction of the plurality of magnetoresistive effect elements 10 (the longitudinal direction of the conductive layer 20).

The non-magnetic layer 13 is provided between the two magnetic layers 11 and 12. The non-magnetic layer 13 functions as a tunnel barrier layer 13. For example, the tunnel barrier layer 13 is an insulating layer including magnesium oxide. The tunnel barrier layer 13 is an extremely thin insulating film through which a tunnel current flows.

In each MTJ element 10 of the memory cell string MS, the storage layer 11 is provided on the conductive layer 20. The reference layer 12 is stacked on the tunnel barrier layer 13 on the storage layer 11. In this embodiment, the magnetization direction of the reference layer 12 is set to a direction from a far side of the view of FIG. 3 toward a near side of the view of FIG. 3.

For example, a magnetic tunnel junction is formed by the two magnetic layers 11 and 12 and the tunnel barrier layer 13. In this embodiment, the magnetoresistive effect element 10 having the magnetic tunnel junction will be referred to as the MTJ element 10 hereinafter.

The resistance value (resistance state) of the MTJ element 10 changes in accordance with a relative relationship (magnetization alignment) between the magnetization direction of the storage layer 11 and that of the reference layer 12. For example, the MTJ element 10 can take the first resistance state or the second resistance state.

For example, the MTJ element 10 has a rectangular parallelepiped structure, and has a rectangular planar shape. Note that the MTJ element 10 may have a square, circular, or elliptic planar shape.

To control the operation of the memory cell string MS, a plurality of transistors TR1, TR2, and TR3 are connected to the memory cell string MS.

For example, the current path (source/drain) of the transistor TR1 is connected to one end of the conductive layer 20 in the longitudinal direction (extending direction or the array direction of the MTJ elements) of the conductive layer 20. The current path of the transistor TR2 is connected to the other end of the conductive layer 20 in the longitudinal direction of the conductive layer 20.

The plurality of transistors TR3 are provided in one-to-one correspondence with the plurality of MTJ elements 10. One end of the current path of each transistor TR3 is connected to the reference layer 12 of the corresponding MTJ element 10. The other end of the current path of each transistor TR3 is connected to the corresponding bit line BL.

Figure 4:
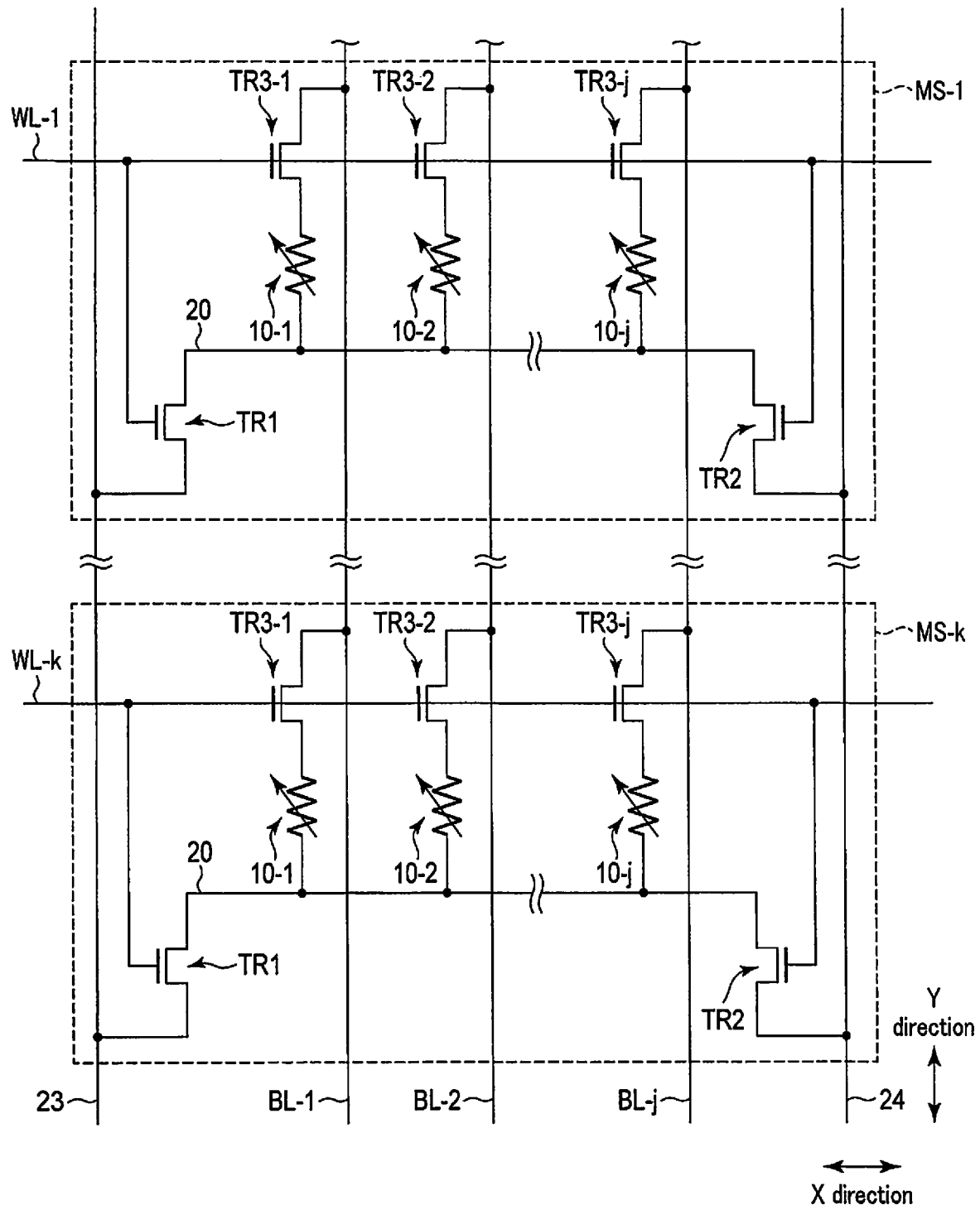

FIG. 4 is an equivalent circuit diagram showing an example of the memory cell array including the memory cell strings of the MRAM according to this embodiment.

As shown in FIG. 4, the plurality of memory cell strings MS (MS-1, . . . , MS-k) are provided in the memory cell array 100. The plurality of memory cell strings MS are arrayed in a Y direction. k is a natural number of 2 or more.

The memory cell array 100 includes the plurality of conductive layers 20. The plurality of conductive layers 20 are separated by the respective memory cell strings MS. One memory cell string MS includes one conductive layer 20.

The memory cell array 100 includes the plurality of bit lines BL (BL-1, BL-2, . . . , BL-j). Each bit line BL is commonly connected to the plurality of memory cell strings MS arrayed in the Y direction.

In each memory cell string MS, the plurality of MTJ elements 10 (10-1, 10-2, . . . , 10-j) are connected to the conductive layer 20.

One terminal of each MTJ element 10 is connected to the conductive layer 20. The other terminal of the MTJ element 10 is connected to a corresponding one of the plurality of bit lines BL via the current path (source/drain) of the corresponding transistor TR3.

The memory cell array 100 includes a plurality of interconnects 23 and 24.

The plurality of interconnects 23 and 24 are commonly connected to the plurality of memory cell strings MS arrayed in the Y direction. The interconnect 23 is connected to one end of each conductive layer 20 via the current path of each transistor TR1. The interconnect 24 is connected to the other end of each conductive layer 20 via the current path of each transistor TR2.

The memory cell array 100 includes a plurality of word lines WL (WL-1, . . . , WL-k). The gates of the transistors TR1, TR2, and TR3 of each memory cell string MS are connected to a corresponding one of the plurality of word lines WL.

The transistors TR1, TR2, and TR3 function as elements for activating (selecting) the memory cell string MS and the MTJ elements (memory cells) 10.

By controlling the potential of the word line WL, the transistors TR1, TR2, and TR3 are turned on or off. This sets at least one (for example, one or more rows) of the plurality of memory cell strings MS in a selected state, and sets the remaining memory cell strings in an unselected state.

By controlling the potential of the bit line BL, a voltage having a predetermined polarity and voltage value is applied to the reference layer 12 of each MTJ element 10.

The supply direction of a current (or a voltage) to the conductive layer 20 is controlled by controlling potentials (current sources/sinks) of the interconnects 23 and 24. For example, in accordance with the direction of a current made flow through the conductive layer 20, one of the two interconnects 23 and 24 is set to a high-potential side (for example, a positive potential, a current source side), and the other is set to a low-potential side (for example, a ground voltage, a current sink side).

The interconnects WL, BL, 23, and 24 are controlled by the row control circuit 110, the column control circuit 120, the write circuit 140, and the read circuit 150 in accordance with an operation to be executed.

Note that the configuration of the memory cell array 100 using the memory cell strings MS is not limited to the example shown in FIG. 4.

(b) Principles

Various principles for executing an operation as the memory device in the MRAM according to this embodiment will be described with reference to FIGS. 5, 6, 7, 8, 9, and 10.

<Magnetoresistive Effect>

Figure 5:
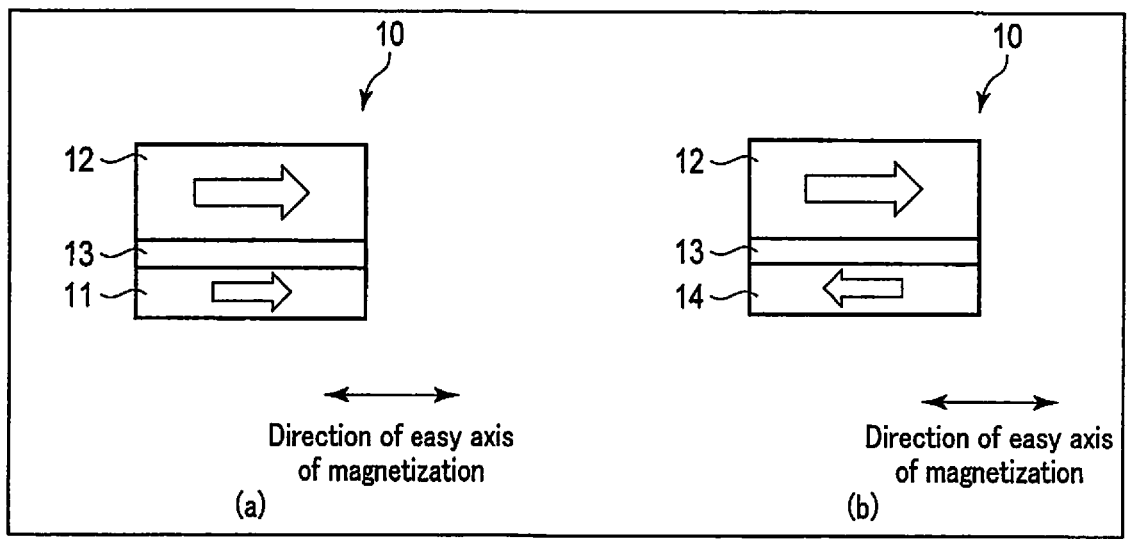

FIG. 5 is a view for explaining the magnetoresistive effect element (MTJ element) as the memory element in the MRAM according to this embodiment.

In FIG. 5, (a) is a view schematically showing the magnetization alignment state of the magnetoresistive effect element when the magnetoresistive effect element has the first resistance state. In FIG. 5, (b) is a view schematically showing the magnetization alignment state of the magnetoresistive effect element when the magnetoresistive effect element has the second resistance state.

As described above, each of the magnetic layers 11 and 12 has the in-plane magnetic anisotropy (parallel magnetic anisotropy). The magnetization direction (the direction of the easy axis of magnetization) of each of the magnetic layers 11 and 12 is substantially parallel to the layer surface of the magnetic layer. The magnetization direction of each of the magnetic layers 11 and 12 is substantially perpendicular to the stacking direction of the plurality of layers 11, 12, and 13. For example, the in-plane magnetic anisotropy of each of the magnetic layers 11 and 12 results from the shape magnetic anisotropy of the magnetic layer or the like. The MTJ element using the in-plane magnetic anisotropy of the magnetic layer will be referred to as an in-plane magnetization type MTJ element (or a parallel magnetization type MTJ element) hereinafter.

The resistance state (resistance value) of the MTJ element 10 changes in accordance with a relative relationship (magnetization alignment) between the magnetization direction of the storage layer 11 and that of the reference layer 12.

As shown in (a) of FIG. 5, if the magnetization direction of the storage layer 11 is the same as that of the reference layer 12, the MTJ element 10 has the first resistance state (first magnetization alignment state). The MTJ element 10 having the first resistance state has a resistance value Rp.

As shown in (b) of FIG. 5, if the magnetization direction of the storage layer 11 is opposite to that of the reference layer 12, the MTJ element 10 has the second resistance state (second magnetization alignment state). The MTJ element 10 having the second resistance state has a resistance value Rap. The resistance value Rap is higher than the resistance value Rp.

Thus, the MTJ element 10 can take one of the low resistance state or the high resistance state in accordance with the magnetization alignment of the two magnetic layers 11 and 12.

A magnetoresistive effect is a phenomenon in which a resistance value changes depending on the relative relationship between the magnetization directions of the two magnetic layers 11 and 12.

For example, the MTJ element 10 holds 1-bit data ("0" data or "1" data). In this case, when the resistance state of the MTJ element 10 is set to the first resistance state, a memory cell is set in the first data holding state (for example, a "0" data holding state). When the resistance state of the MTJ element 10 is set to the second resistance state, the memory cell is set in the second data holding state (for example, a "1" data holding state).

In this embodiment, the magnetization alignment state in which the magnetization direction of the storage layer 11 and that of the reference layer 12 in the MTJ element 10 are the same will be referred to as a parallel state (or P state) hereinafter. The magnetization alignment state in which the magnetization direction of the storage layer 11 and that of the reference layer 12 in the MTJ element 10 are opposite will be referred to as an antiparallel state (or AP state) hereinafter.

As will be described below, in the MRAM according to this embodiment, a spin Hall effect and a voltage effect are used to control the magnetization alignment (P/AP state) of the MTJ element 10.

<Spin Hall Effect>

The spin Hall effect used in the MRAM according to this embodiment will be described with reference to FIG. 6.

Figure 6:
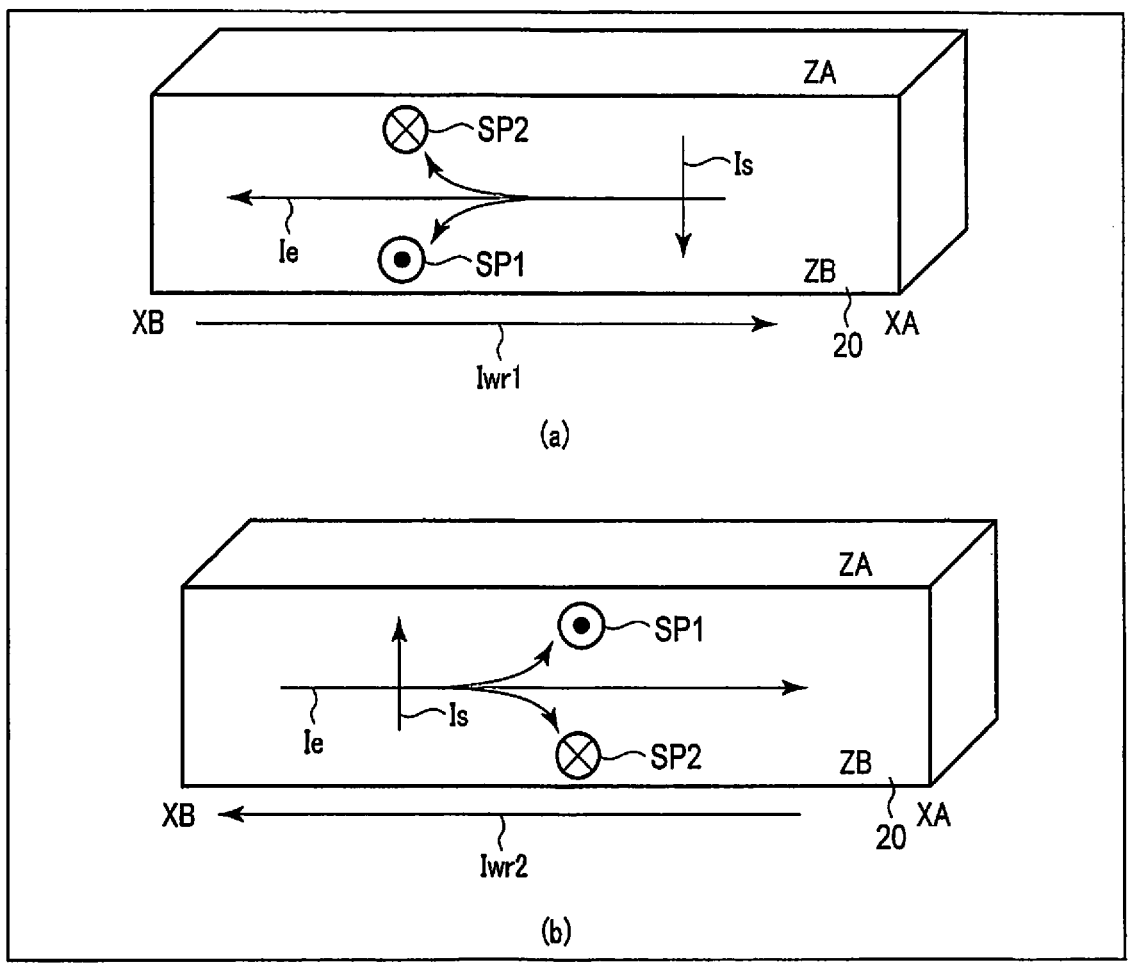

In FIG. 6, (a) and (b) are schematic views for explaining the spin Hall effect. In (a) and (b) of FIG. 6, the MTJ elements 10 are provided on the "ZA"-side surface (to be referred to as the surface of the conductive layer 20 hereinafter) of the conductive layer 20.

In the MRAM according to this embodiment, the spin Hall effect (or to be also referred to as Spin Orbit Torque: SOT) is used for magnetization switching of the storage layer of the MTJ element 10.

For example, a material having spin orbit interaction is used to develop the spin Hall effect.

In (a) and (b) of FIG. 6, the conductive layer 20 is made of a material having large spin orbit interaction. For example, the conductive layer 20 is a layer made of at least one material selected from metals such as copper (Cu), rhodium (Rh), palladium (Pd), silver (Ag), hafnium (Hf), tantalum (Ta), tungsten (W), rhenium (Re), osmium (Os), iridium (Ir), platinum (Pt), gold (Au), and bismuth (Bi), an oxide including one or more of these metals, and a nitride including one or more of these metals. The material of the conductive layer is not limited to them, and may be any material having large spin orbit interaction.

The conductive layer 20 will be also referred to as a spin orbit interaction layer (SO layer) hereinafter.

A current Iwr (Iwr1 or Iwr2) is supplied to the conductive layer 20. The current (write current) Iwr includes a charge (electron) having an upspin SP1 and a charge having a downspin SP2.

When the current Iwr flows through the conductive layer 20, the upspin SP1 and the downspin SP2 are scattered in opposite directions in accordance with the flowing direction of the current (the direction of the spin).

A relationship among a spin (represented as "S"), a spin flow (represented as "Is"), and an electron flow (represented as "Ie") is given by an equation (A) below. Note that the direction of the electron flow "Ie" is opposite to the flowing direction of the current Iwr. "S" represents a vector.

$$Is \propto S \times Ie \quad (A)$$

As given by the equation (A), the spin flow "Is" is proportional to an outer product of the spin "S" and the electron flow "Ie".

As a result, the spin flow "Is" occurs in the conductive layer 20 having the spin orbit interaction. A phenomenon that generates the spin flow Is is the spin Hall effect.

When the current Iwr flows through the conductive layer 20, the spin flow Is is generated in the conductive layer 20.

For example, as shown in (a) of FIG. 6, when the current Iwr1 flows from the "XB" side (left side) to the "XA" side (right side) of the conductive layer 20 in the view, the upspin SP1 is scattered to the "ZB" side of the conductive layer 20 (the back side of the conductive layer 20), and the downspin SP2 is scattered to the "ZA" side of the conductive layer 20 (the front side of the conductive layer 20).

For example, as shown in (b) of FIG. 6, when the current Iwr2 flows from the "XA" side to the "XB" side of the conductive layer 20 in the view, the upspin SP1 is scattered to the "ZA" side of the conductive layer 20, and the downspin SP2 is scattered to the "ZB" side of the conductive layer 20.

As shown in (a) and (b) of FIG. 6, by reversing the polarity (the flowing direction of the current) of the current Iwr supplied to the conductive layer 20, the direction of spin torque acting on the storage layer 11 of the MTJ element 10 on the conductive layer 20 is reversed.

The spin orbit torque (SOT) resulting from the spin flow Is generated by the spin Hall effect is applied to the MTJ element 10 on the conductive layer 20.

The direction of the spin acting on the storage layer 11 as the spin orbit torque changes in accordance with the direction of the current Iwr flowing through the conductive layer 20.

It is, therefore, possible to control the magnetization direction of the storage layer 11 to a direction parallel or antiparallel to the magnetization direction of the reference layer 12 by controlling the direction of the current Iwr flowing through the conductive layer 20.

Thus, in the MRAM according to this embodiment, the magnetization direction of the storage layer 11 of the MTJ element 10 can be changed (reversed) by the spin Hall effect in accordance with the direction of the applied spin.

The MRAM using the spin Hall effect can write data in the MTJ element 10 without causing a current to directly flow through the tunnel barrier layer 13. Therefore, destruction of the tunnel barrier layer 13 can be suppressed in the MRAM using the spin Hall effect.

Furthermore, in the MRAM using the spin Hall effect, a current path in the write operation is different from that in the read operation. Therefore, substantially no read disturbance occurs in the MRAM using the spin Hall effect.

In the structure in which the plurality of MTJ elements 10 are arranged on one conductive layer 20, as shown in FIG. 3, the write operation can be collectively performed for the plurality of MTJ elements 10 using the spin Hall effect.

This can reduce the write energy (for example, power consumption) per bit and the cell size in the MRAM according to this embodiment.

In the configuration shown in FIG. 3, when the current Iwr is made flow through the conductive layer 20, the plurality of MTJ elements 10 on the conductive layer 20 may include an element (selected element) in which data is written and an element (unselected element) in which no data is written. The selected element is the MTJ element in which the magnetization of the storage layer 11 should be switched at the time of the write operation. The unselected element is the MTJ element in which the magnetization of the storage layer 11 is not switched at the time of the write operation.

As will be described below, the MRAM according to this embodiment controls whether or not to write data in the plurality of MTJ elements 10 on the common conductive layer 20 by a voltage effect (VCMA: Voltage-Controlled Magnetic Anisotropy).

<Voltage Effect>

The voltage effect of the magnetoresistive effect element in the MRAM according to this embodiment will be described with reference to FIG. 7.

The voltage effect is a phenomenon in which magnetic anisotropy energy (for example, perpendicular magnetic anisotropy energy) of the storage layer 11 is changed by applying a voltage between the storage layer 11 and the reference layer 12 of the MTJ element 10.

An energy barrier between the parallel state (P state) and the antiparallel state (AP state) in the MTJ element 10 is changed by changing the perpendicular magnetic anisotropy of the storage layer 11.

This makes it possible to control an increase and decrease in magnetization switching current (magnetization switching threshold value) Ic of the MTJ element caused by the spin Hall effect. The magnetization switching current/magnetization switching threshold value is the current value of a current that generates spin orbit torque (spin flow) capable of reversing the direction of the magnetization of the storage layer of the write target MTJ element.

For example, as shown in FIG. 7 (and FIG. 5), an in-plane magnetization film is used for the MTJ element 10. In the in-plane magnetization film, the magnetization directions of the storage layer 11 and the reference layer 12 are parallel to the layer surfaces (film surfaces) of the magnetic layers 11 and 12.

In the MTJ element 10 using the in-plane magnetization film, if a voltage VCNT is applied to the MTJ element 10 to increase the perpendicular magnetic anisotropy energy of the storage layer 11 (bring the storage layer 11 closer to a perpendicular stable state), the in-plane magnetic anisotropy energy relatively decreases, resulting in a reduction in the magnetization switching threshold value Ic of the storage layer 11.

To the contrary, if the perpendicular magnetic anisotropy energy of the storage layer 11 is decreased (in-plane magnetization is stabilized more) by applying the voltage VCNT, the magnetization switching threshold value Ic of the storage layer 11 increases.

Note that when a perpendicular magnetization film is used for the MTJ element, the relationship between the perpendicular magnetic anisotropy energy and the voltage in the MTJ element for which the perpendicular magnetization film is used is reverse to the relationship between the perpendicular magnetic anisotropy energy and the voltage in the MTJ element for which the in-plane magnetization film is used.

An increase/decrease in the magnetization switching threshold value Ic caused by voltage application is determined in accordance with the polarity of a voltage (to be also referred to as an MTJ voltage or control voltage hereinafter) applied to the MTJ element. The MTJ voltage is the potential difference between the potential (the potential on the side of the storage layer) of the conductive layer 20 and the potential on the side of the transistor TR3 on the upper portion of the MTJ element 10 with reference to the potential on the side of the conductive layer 20 below the MTJ element 10.

For example, in an in-plane magnetization type MTJ element as one example, a CoFeB layer is used for a storage layer, and an MgO layer is used for a tunnel barrier layer.

As shown in (a) of FIG. 7, in the in-plane magnetization type MTJ element 10, when the MTJ voltage VCNT (to be referred to as a voltage Va hereinafter) having a negative voltage value Va is applied to the reference layer 12 (the potential on the storage layer side is higher than that on the reference layer side), the magnetization switching threshold value Ic of the storage layer 11 decreases.

As shown in (b) of FIG. 7, in the in-plane magnetization type MTJ element 10, when the MTJ voltage VCNT (to be referred to as a voltage Vd hereinafter) having a positive voltage value Vd (or 0 V) is applied to the reference layer 12 (the potential on the reference layer side is higher than that on the storage layer side), the magnetization switching threshold value Ic of the storage layer 11 increases.

When a change in magnetization switching threshold value of the storage layer 11 caused by the voltage effect is used, the magnetization switching threshold value Ic of the write target MTJ element (selected element) among the plurality of MTJ elements 10 arrayed on the same conductive layer 20 is set to a value equal to or smaller than the current value of the write current Iwr by a potential state shown in (a) of FIG. 7, and the magnetization switching threshold value Ic of the non-write target MTJ element (unselected element) 10 is set to a value larger than the current value of the write current Iwr by a potential state shown in (b) of FIG. 7.

When the current value of the write current is set in consideration of a variation in magnetization switching threshold value caused by the voltage effect, data can be selectively written in the plurality of MTJ elements 10 arrayed on the same conductive layer 20.

As will be described below, the MRAM according to this embodiment can control write of data in the plurality of MTJ elements 10 in the memory cell string MS.

<Write Operation>

The MRAM according to this embodiment can perform the write operation, as will be described below, based on the phenomena/principles described above with reference to FIGS. 5, 6, and 7.

Figure 8:
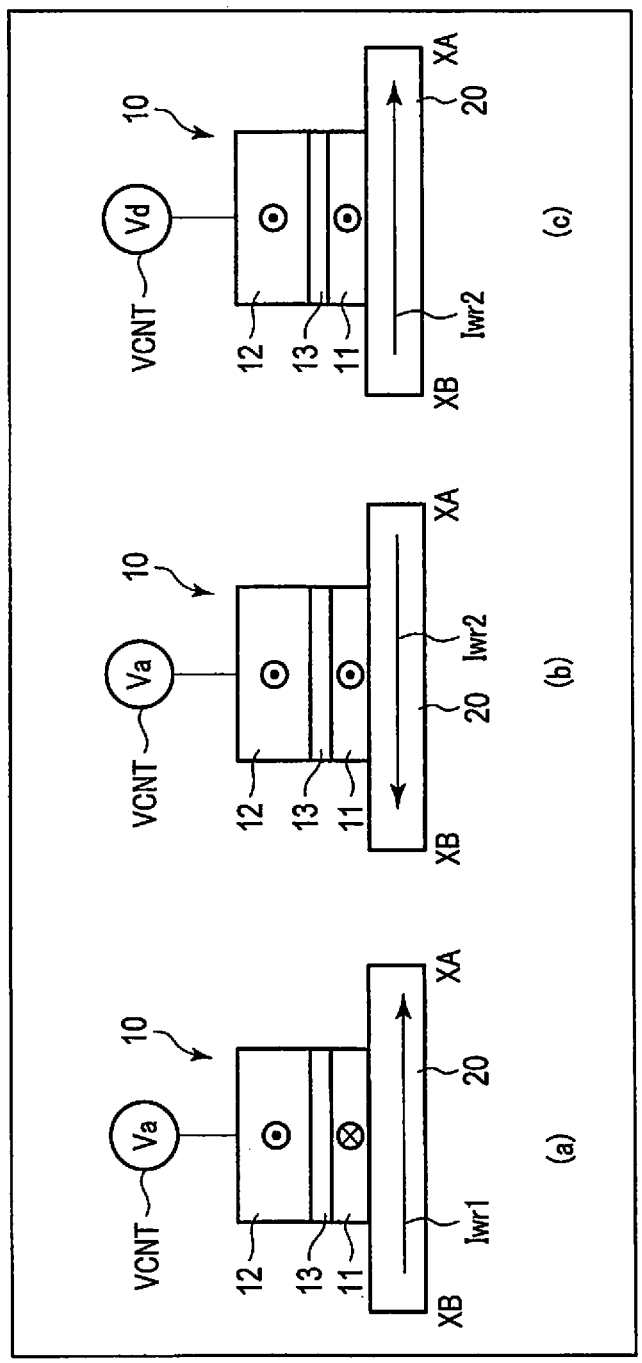

FIG. 8 is a schematic diagram for explaining a basic example of the write operation of the MRAM according to this embodiment.

In FIG. 8, (a) and (b) are schematic views for explaining write of data in the MTJ element.

In the data write operation of the MRAM according to this embodiment, the MTJ voltage Va having a predetermined polarity and voltage value is applied to the MTJ element 10 so as to decrease the magnetization switching threshold value Ic of the storage layer 11 of the MTJ element 10 in the MTJ element as a data write target. In a state in which the magnetization switching threshold value Ic of the storage layer 11 is decreased, a write current flowing in a direction according to data to be written is supplied to the conductive layer 20.

The spin generated by the spin Hall effect is applied to the MTJ element 10 on the conductive layer 20, thereby reversing the magnetization direction of the storage layer.

As shown in (a) of FIG. 8, if data (for example, "1" data) corresponding to the AP state is written in the MTJ element 10, the MTJ voltage VCNT (selection voltage Va) having a negative voltage value is applied to the reference layer 12 of the MTJ element 10 so that the potential on the reference layer side of the MTJ element 10 is lower than that on the storage layer side.

For example, the write current Iwr1 is supplied to the conductive layer 20 so that the write current Iwr1 flows from the XB side to the XA side of the conductive layer 20.

This writes, in the MTJ element on the conductive layer 20, the data corresponding to the AP state of the MTJ element 10.

As shown in (b) of FIG. 8, if data (for example, "0" data) corresponding to the P state is written in the MTJ element 10

(the MTJ element 10 is set in a selected state), the MTJ voltage VCNT (selection voltage Va) having a negative voltage value is applied to the reference layer 12 of the MTJ element 10 so that the potential on the reference layer side of the MTJ element 10 is lower than that on the storage layer side.

In FIG. 8, (c) is a schematic view for explaining inhibition (suppression) of write of data in the MTJ element.

For example, the write current Iwr2 is supplied to the conductive layer 20 so that the write current Iwr2 flows from the XA side to the XB side of the conductive layer 20.

This writes, in the MTJ element on the conductive layer 20, the data corresponding to the P state of the MTJ element 10.

As described above, in one memory cell string, the plurality of MTJ elements 10 are arrayed on the common conductive layer 20.

Therefore, in the memory cell string, there can exist the non-write target MTJ elements in addition to the write target MTJ elements in accordance with data to be written (the supply direction of the write current).

For example, the selection voltage Va is applied to the write target MTJ element (selected element) 10 among the plurality of MTJ elements 10 on the conductive layer 20 so that the magnetization switching threshold value Ic of the storage layer 11 decreases in the MTJ element 10. To the contrary, the MTJ voltage VCNT having the predetermined polarity and voltage value Vd is applied to the non-write target MTJ element (unselected element) 10 among the MTJ elements on the conductive layer 20 so that the magnetization switching threshold value Ic of the storage layer 11 increases in the MTJ element 10.

As shown in (c) of FIG. 8, when no data is written in the MTJ element 10 (the MTJ element 10 is set in an unselected state), the MTJ voltage VCNT (non-selection voltage Vd) having the positive voltage value Vd is applied to the reference layer 12 of the MTJ element 10 so that the potential on the reference layer side of the MTJ element 10 is higher than that on the storage layer side.

Therefore, even if the write current Iwr2 (or write current Iwr1) flows through the conductive layer 20, write of data (magnetization switching of the storage layer 11) does not occur in the unselected MTJ element 10.

Thus, among the plurality of MTJ elements 10 on the conductive layer 20, the magnetization alignment of the write target MTJ element is selectively changed from the AP state to the P state (or from the P state to the AP state) by the spin Hall effect and the voltage effect, and the magnetization alignment of the non-write target MTJ element is maintained in the AP state (or the P state).

In the MRAM according to this embodiment, write of data in a "1/0" array pattern can be implemented for the plurality of MTJ elements on the common conductive layer 20.

In this embodiment, the memory that executes the write operation by these principles will be referred to as a voltage control spintronic memory (VoCSM) or a voltage control magnetic memory hereinafter.

As described above, at the time of the write operation of the VoCSM, the MTJ voltages Va and Vd corresponding to write and non-write are applied to the respective MTJ elements 10 in accordance with the data code (the array pattern of "1" and "0") of the data to be written in the memory cell string MS.

The negative bias (voltage Va) is applied to each write target MTJ element and the positive bias (voltage Vd) is applied to each non-write target MTJ element. Each MTJ element 10 has a finite resistance value. Therefore, at the time of application of the voltage Va or Vd, a current (to be referred to as an MTJ current hereinafter) flows between the memory element 10 and the conductive layer 20.

In the selected memory cell string, the bias direction (the polarity of the voltage) of the voltage (MTJ voltage) VCNT applied to the MTJ element changes depending on the data code (data pattern) of the write data. Thus, the direction and current amount of the MTJ current change depending on the polarity of the MTJ voltage (selection/non-selection of the MTJ element). The current value of the current in the conductive layer varies due to an inflow or outflow of the MTJ current corresponding to the data code.

The current value of the write current is set in consideration of a variation in current value of the write current caused by the MTJ current. In many data patterns that the write data can take, it is desired to supply, to the conductive layer 20, the write current having a current value larger than a logical value. As a result, the area of a peripheral circuit in a chip, such as a write circuit, may be increased and/or complicated.

In the magnetic memory (VoCSM or MRAM) according to this embodiment, at the time of write of data, i-bit data is converted into j-bit (j>i) data. For example, "i" and "j" have a relationship of "j≥i+2".

The j-bit data is written as write data in the memory cell string MS of the memory cell array 100. The memory cell string MS includes the j MTJ elements (memory elements) 10. Thus, one memory cell string MS holds j-bit data.

The j-bit data includes m "1"s and n "0"s in accordance with the data pattern. "n" is equal to "j–m". m and n are natural numbers of 1 or more.

In the VoCSM according to this embodiment, for example, m and j have a relationship given by an equation (B):

$$j/2-1 \leq m \leq j/2+1 \tag{B}$$

Therefore, at the time of the write operation of the VoCSM according to this embodiment, the number of selected elements among the MTJ elements in the memory cell string is almost equal to the number of unselected elements.

As a result, the VoCSM according to this embodiment can substantially uniform the current value of the write current supplied to the conductive layer 20 independently of the data pattern of the write data.

(b) Practical Example

A practical example of the magnetic memory (for example, the VoCSM or MRAM) according to this embodiment will be described with reference to FIGS. 9, 10, 11, 12, and 13.

Figure 9:
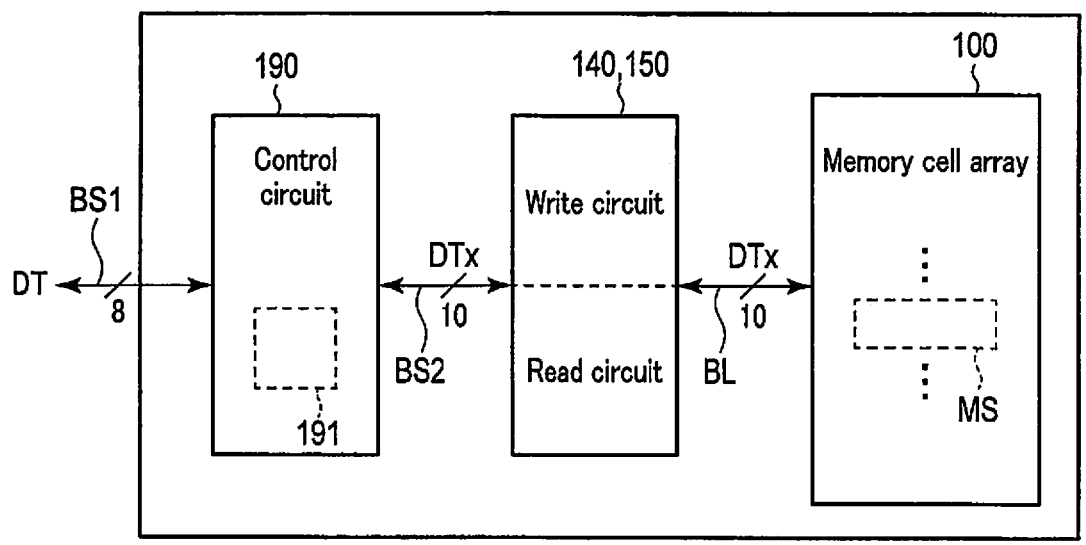

FIG. 9 is a schematic block diagram for explaining the circuit configuration (for example, the memory macro) of the VoCSM (MRAM) according to this embodiment.

Referring to FIG. 9, among the plurality of circuits in the VoCSM, circuits related to conversion of the number of bits of data are extracted and shown.

For example, data transfer between the controller 5 and the VoCSM 1 of this embodiment is executed with an 8-bit data width.

For example, 8-bit data DT is transmitted/received using an I/O bus (for example, eight data lines) BS1 between the controller 5 and the VoCSM 1 of this embodiment.

The control circuit 190 can convert the 8-bit data DT into 10-bit data DTx by calculation processing of the circuit 191 or a conversion table (and inversion table) in the circuit 191.

The control circuit 190 can convert the 10-bit data DTx into the 8-bit data DT by the calculation processing of the circuit 191 or the conversion table.

Data transfer between the control circuit 190 and the write circuit 140 and that between the control circuit 190 and the read circuit 150 are executed with a 10-bit data width.

The control circuit 190 transmits the converted 10-bit data DTx to the write circuit 140 via an internal bus (for example, a group of 10 data lines) BS2.

At the time of the write operation, the write circuit 140 controls the potentials of the 10 bit lines BL in accordance with the write data. This applies one of the selection voltage Va and the non-selection voltage Vd to each MTJ element 10 in the selected memory cell string in accordance with the data pattern of the write data.

At the time of the read operation, the read circuit 150 senses the current values of the currents flowing through the 10 bit lines BL (or the variation amounts of the potentials of the bit lines BL). This reads the 10-bit data DTx held in the memory cell string MS.

The read circuit 150 transmits, to the control circuit 190 via the internal bus BS2, the data DTx read from the memory cell string MS. The 10-bit data DTx is converted into the 8-bit data DT by the control circuit 190. The 8-bit data DT is transmitted to the controller 5 and/or the host device 900.

Data conversion from the 10-bit data DTx into the 8-bit data DT will sometimes be referred to as data inversion hereinafter.

Note that the internal bus BS2 may be shared by the write circuit 140 and the read circuit 150. The internal bus BS2 may be independently provided in each of the write circuit 140 and the read circuit 150.

The data conversion circuit 191 may be provided separately from the control circuit 190. For example, the data conversion circuit 191 may be provided on the data path between the I/O circuit 160 and the write circuit 140/read circuit 150 outside the control circuit 190.

Figure 10:
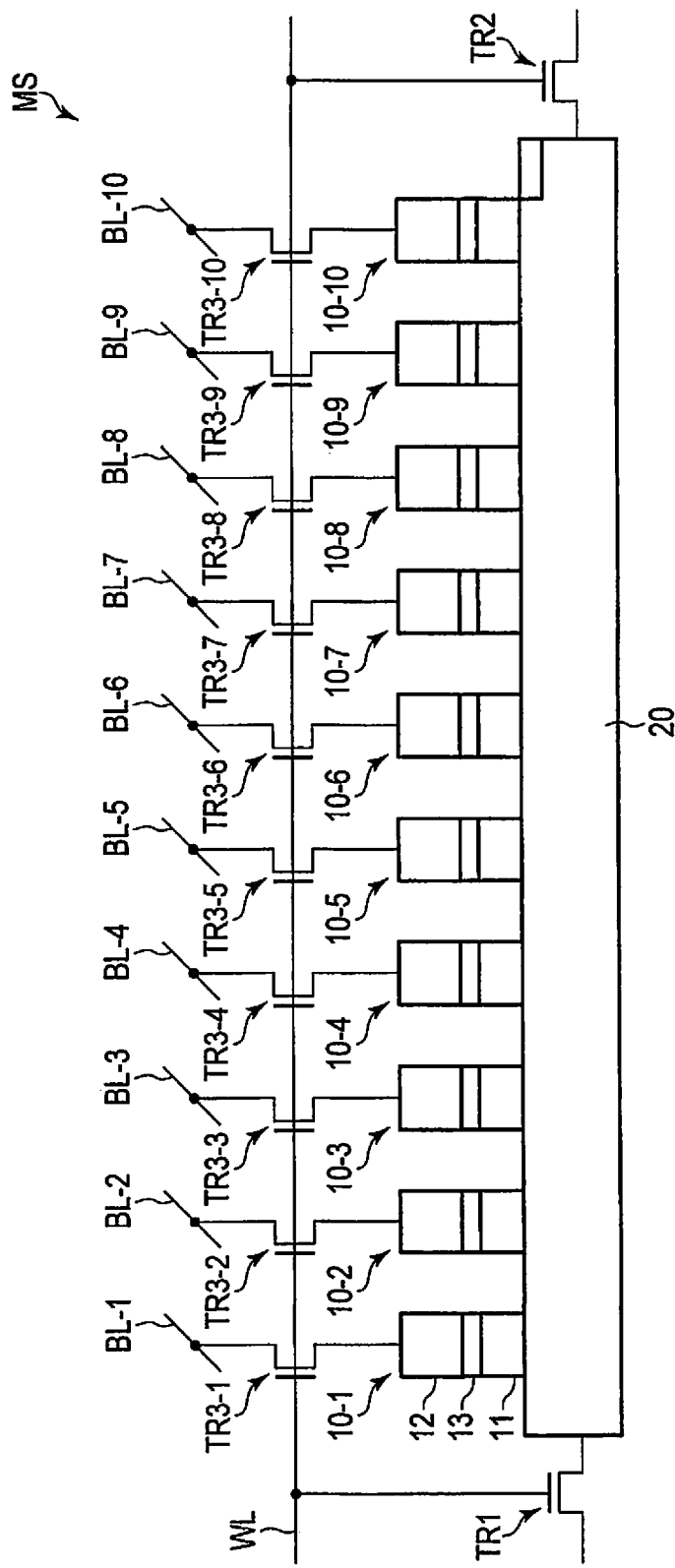

FIG. 10 is a schematic view for explaining an example of the configuration of the memory cell string of the VoCSM according to this embodiment.

If externally obtained 8-bit data is converted into 10-bit data and stored in the VoCSM 1, the memory cell string MS includes the 10 MTJ elements 10-1, 10-2, . . . , 10-10 to hold the 10-bit data DTx, as shown in FIG. 10. The 10 MTJ elements 10 are arrayed on one conductive layer 20 in the X direction.

10 transistors TR3-1, TR3-2, . . . , TR3-10 are provided in the memory cell string MS in one-to-one correspondence with the MTJ elements 10-1 to 10-10.

The 10 bit lines BL-1, BL-2, . . . , BL-10 are connected to the one memory cell string MS. The one bit line BL is connected to the corresponding MTJ element 10 via the transistor TR3.

Figure 11:
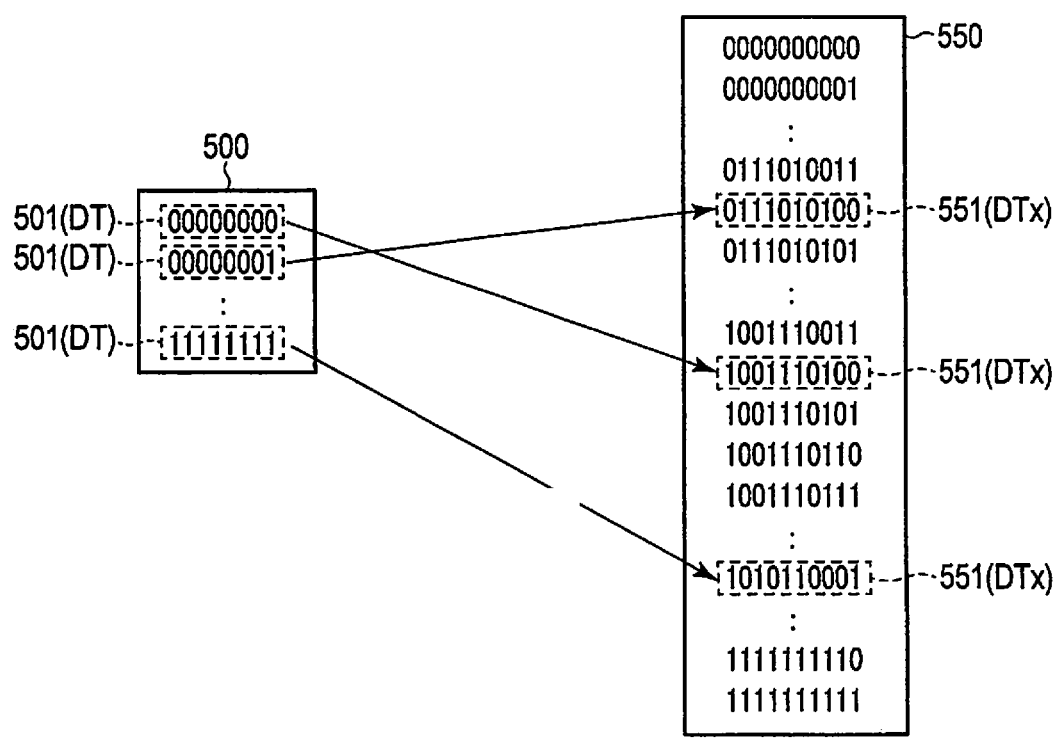

FIG. 11 is a schematic view for explaining data conversion in the VoCSM according to this embodiment.

As shown in FIG. 11, the data DT in an 8-bit data space 500 is converted into a correspondence data code 551 in a 10-bit data space 550 in accordance with a data code (data pattern) 501 of the data DT.

In the 8-bit data space 500, there exist 256 data codes 501. In the 10-bit data space 550, there exist 252 10-bit data codes each including five "1"s, and 210 10-bit data codes each including six "1"s.

For example, in this embodiment, each of 134 data codes among the 8-bit data codes 501 is converted into a corresponding one of the 10-bit data codes each including five "1"s in the 10-bit data space 550.

Each of the remaining 122 codes among the 8-bit data codes is converted into a corresponding one of the 10-bit data codes each including six "1"s in the 10-bit data space 550.

This maps the 256 data codes 501 of the 8-bit data on the 10-bit data space 550. Thus, each data code 501 is converted into a corresponding one of the 256 10-bit data codes.

Note that each of the 252 data codes among the 8-bit data codes 501 may be converted into a corresponding one of the 10-bit data codes each including five "1"s, and each of the remaining four codes among the 8-bit data codes may be converted into a corresponding one of the 10-bit data codes each including six "1"s.

FIG. 12 is a table showing an example of mapping (conversion table) for converting 8-bit data into 10-bit data.

As shown in FIG. 12, each of the 10-bit data codes includes five or six "1"s.

For example, an 8-bit data code 501a of "00000000" is converted into a 10-bit data code 551a of "1001110100".

An 8-bit data code 501b of "00010001" is converted into a 10-bit data code 551b of "1000111011".

An 8-bit data code 501c of "00011110" is converted into a 10-bit data code 551c of "0111100100".

As shown in the data conversion table of FIG. 12, each 8-bit data is mapped on the 10-bit data space.

Note that in the 10-bit data space 550, instead of the 10-bit data code including six "1"s, a 10-bit data code including four "1"s may be used for conversion from an 8-bit data code into a 10-bit data code. Note that 210 10-bit data codes each including four "1"s exist in the 10-bit data space 550.

If the data conversion circuit 191 converts the number of bits and data code of the data DT or DTx using the conversion table, it has the conversion table (and inversion table) indicating the correspondence between the codes, as shown in FIG. 12.

Figure 13:
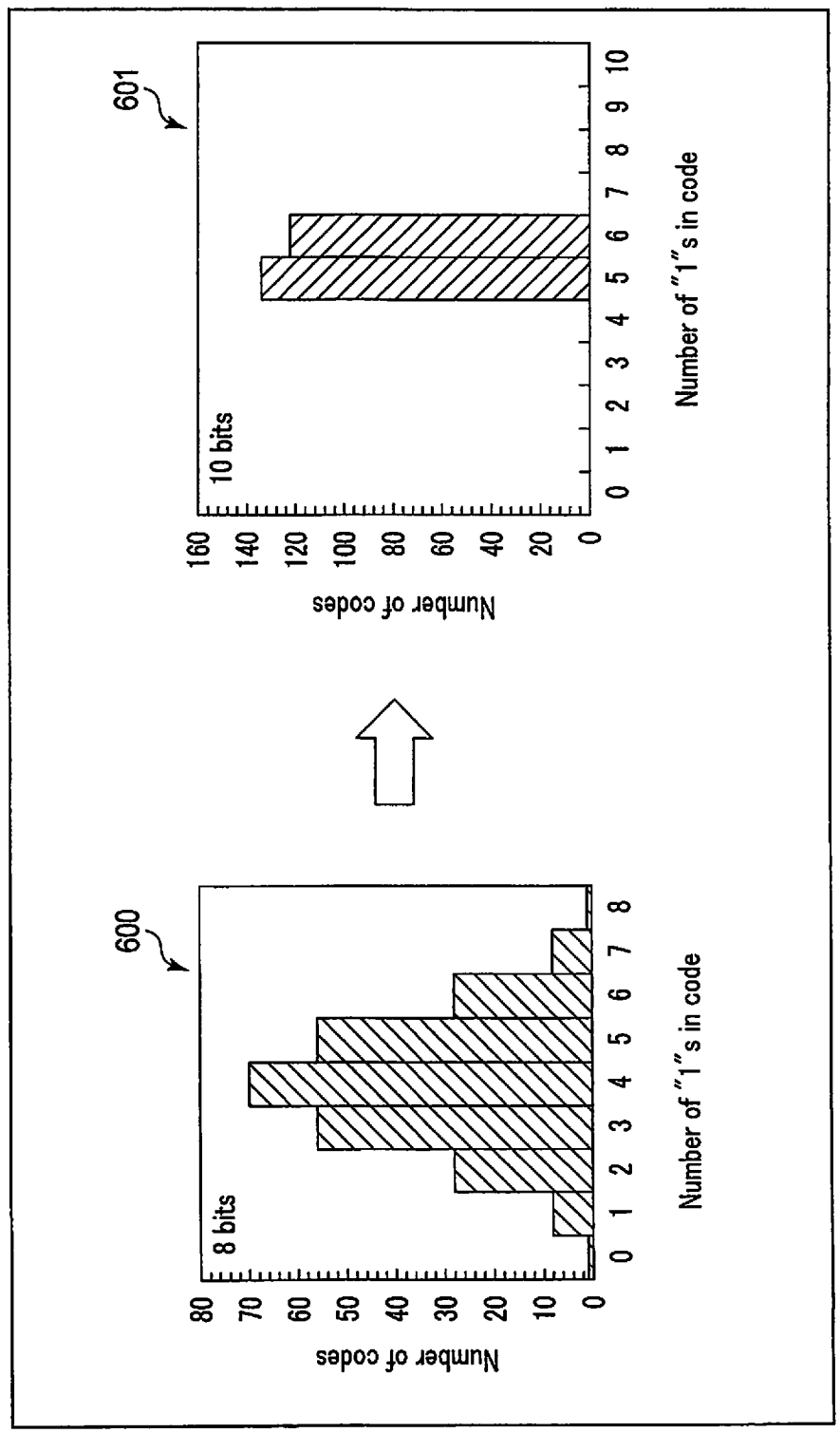

FIG. 13 shows graphs of the distributions of the numbers of "1"s (symbols) in data codes at the time of data conversion from 8-bit data into 10-bit data in the VoCSM according to this embodiment.

In each of the graphs shown in FIG. 13, the abscissa corresponds to the number of "1"s in a data code, and the ordinate corresponds to the number of data codes for each number of "1"s.

As shown in FIG. 13, the numbers of "1"s in the 8-bit data before conversion are distributed within the range of 0 to 8 in accordance with the data codes of the 8-bit data.

When the 8-bit data are converted into 10-bit data, the numbers of "1"s in the data after conversion from the 8-bit data into the 10-bit data are concentrated into the range (distribution) of 5 to 6.

As described above, data conversion executed for data obtained from the outside of the magnetic memory so as to satisfy "j/2−1≤m≤j/2+1" substantially uniforms, in the magnetic memory, the number (m) of specific symbols (in this example, "1"s) in j-bit write data.

As described above, the VoCSM 1 according to this embodiment converts the externally obtained 8-bit data DT into the 10-bit data DTx, and stores the 10-bit data DTx in the memory cell array 100. The VoCSM 1 according to this embodiment converts the 10-bit data DTx in the memory cell array 100 into the 8-bit data DT, and transfers the 8-bit data outside the VoCSM 1.

Note that the controller 5 may execute conversion from 8-bit data into 10-bit data and conversion from 10-bit data into 8-bit data.

(c) Operation Example

An example of the operation of the magnetic memory (VoCSM or MRAM) according to this embodiment will be described with reference to FIGS. 14, 15, 16, and 17.

<Write Operation>

FIG. 14 is a flowchart for explaining the write operation of the VoCSM according to this embodiment.

As shown in FIG. 14, as for the operation of a system including the VoCSM according to this embodiment, the host device 900 requests write of i-bit data (in this example, 8-bit data) in the VoCSM 1 according to this embodiment. The host device 900 transmits a write request and write data to the controller 5.

The controller 5 receives the write request and data. In response to the write request, the controller 5 transmits the write command CMD, the 8-bit data DT, and the selected address ADR to the VoCSM 1 according to this embodiment.

The VoCSM 1 according to this embodiment receives the write command CMD, the 8-bit data DT, and the selected address ADR (step ST10).

In the VoCSM 1 according to this embodiment, the control circuit 190 converts the 8-bit write data received from the controller 5 into j-bit data (in this example, 10-bit data) DTx by the calculation processing of the circuit 191 or the conversion table in the circuit 191 (step ST11).

In conversion from i-bit data into j-bit data, the i-bit bit data DT is converted into the j-bit data DTx so that the number (m) of symbols "1" in the converted j-bit data satisfies inequality (B) above.

In this embodiment, as shown in FIGS. 11, 12, and 13 described above, the number of "1"s in the converted 10-bit data DTx is five or six. In this case, if the number of "1"s is five, the number of "0"s in the 10-bit data DTx is five. If the number of "1"s is six, the number of "0"s in the 10-bit data DTx is four.

As described above, in the VoCSM according to this embodiment, the number of "1"s in the write data DTx stored in the VoCSM 1 is almost equal to that of "0"s.

The control circuit 190 transmits the converted 10-bit write data DTx to the write circuit 140.

For example, the selected address ADR is supplied to the decode circuit 130. The address ADR is decoded by the decode circuit 130. The decode circuit 130 transmits the decoding result of the selected address ADR to the row control circuit 110 and the column control circuit 120.

The row control circuit 110 activates the word line WL corresponding to the decoding result of the selected address ADR. The column control circuit 120 activates the plurality of bit lines BL corresponding to the decoding result of the selected address ADR.

Thus, the memory cell string (to be referred to as a selected string hereinafter) MS corresponding to the selected address ADR is selected and activated by the row control circuit 110 and the column control circuit 120.

The control circuit 190 and the write circuit 140 write the converted 10-bit data DTx in the selected string MS (step ST12).

At the time of write (programming) of the data in the selected string MS, the write circuit 140 controls the potentials of the bit lines BL via the column control circuit 120.

This sets the voltage value of the MTJ voltage VCNT of each MTJ element 10 in accordance with selection/non-selection of the MTJ element 10.

For example, in the VoCSM 1 according to this embodiment, the write operation is executed by a two-stage program (program step).

When the values ("0" and "1") of bits included in the 10-bit write data DTx are written in the corresponding MTJ elements 10 in the memory cell string MS, the write operation includes the first program and the second program.

In the first program, one of "0" and "1" data is written in all the MTJ elements 10 in the selected string MS. In the second program, the other one of the "0" and "1" data is written in the selected MTJ elements 10 in the selected string MS.

Figure 15:
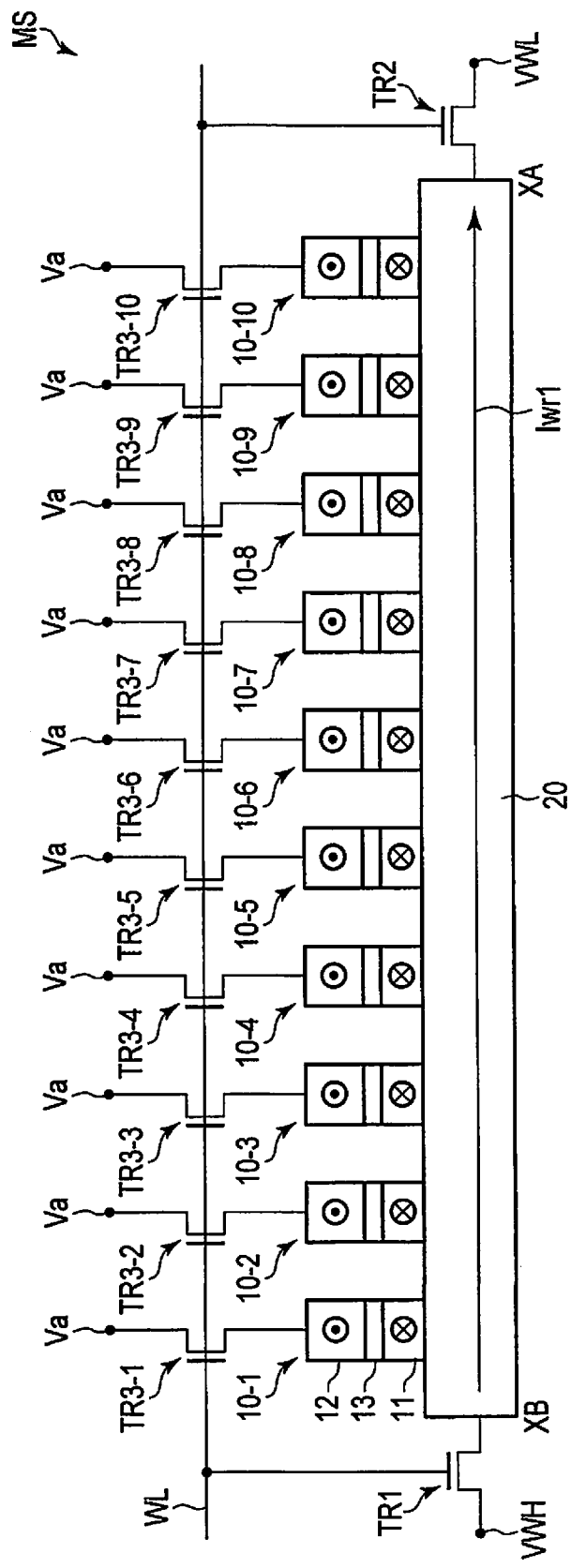

FIGS. 15 and 16 are schematic views for explaining the write operation of the VoCSM according to this embodiment.

If the 10 MTJ elements 10 (of 10 bits) are arranged on the one conductive layer 20, for example, the first program sets the magnetization alignment states of all the 10 MTJ elements 10 to the AP state.

As shown in FIG. 15, the MTJ voltage (selection voltage Va) having the predetermined polarity and voltage value is applied to each of the 10 MTJ elements 10 via the corresponding bit line BL and transistor TR3 so as to decrease the magnetization switching threshold value Ic for the storage layers 11 of all the MTJ elements 10 on the conductive layer 20.

In a state in which the magnetization switching threshold value Ic for the storage layers 11 is decreased, the spin generated by the spin Hall effect is applied to the MTJ elements 10 on the conductive layer 20.

When data is written in the MTJ element, the selection voltage (for example, the negative voltage value) Va is applied as the MTJ voltage VCNT to the reference layer 12 of the MTJ element 10 via the bit line BL and transistor TR 3 so that the potential on the reference layer side of the MTJ element 10 is lower than that on the storage layer side.

For example, if data (for example, "1" data) corresponding to the AP state is written in the MTJ element 10, the write circuit 140 supplies the write current Iwr1 to the conductive layer 20 so that the write current ("1" program current) Iwr1 flows from the XB side to the XA side of the conductive layer 20.

This writes the data corresponding to the AP state of the MTJ element 10 in all the MTJ elements 10 on the conductive layer 20 collectively.

In the second program after the first program, data different from the data written in the first program is written in a predetermined MTJ element in accordance with 10-bit write data DTx.

If the data corresponding to the AP state is written in the first program, the MTJ element in which data (in this example, "0" data) corresponding to the P state is to be written is set as a write target and the element in which data corresponding to the AP state is to be written (the MTJ element that should be maintained in the AP state) is set as a non-write target in the second program.

As shown in FIG. 16, the selection voltage Va is applied to each of the MTJ elements 10-1, 10-3, 10-6, 10-9, and 10-10 via the bit line BL and transistor TR3 so that the magnetization switching threshold value Ic of the storage layer 11 decreases in the write target MTJ element (selected element) among the plurality of MTJ elements 10 on the conductive layer 20.

To the contrary, a non-selection voltage Vd having the predetermined polarity and voltage value is applied to each of the MTJ elements 10-2, 10-4, 10-5, 10-7, and 10-8 via the bit line BL and transistor TR3 so that the magnetization switching threshold value Ic of the storage layer 11 increases in the non-write target MTJ element (unselected element) 10 among the MTJ elements on the conductive layer 20.

In a state in which the predetermined MTJ voltages are applied to the selected and unselected MTJ elements, respectively, the write circuit 140 causes the write current ("0" program current) Iwr2 to flow through the conductive layer 20. The direction of the write current Iwr2 in the second program is opposite to that of the write current Iwr1 in the first program. In this example, the write current Iwr2 flows from the XA side to the XB side of the conductive layer 20.

By applying the non-selection voltage Vd to the MTJ elements 10, the magnetization switching threshold value of the storage layer 11 of each unselected MTJ element 10 (for example, the MTJ element 10-2, 10-4, 10-5, 10-7, or 10-8) is larger than that of the storage layer 11 of each selected MTJ element 10 (for example, the MTJ element 10-1, 10-3, 10-6, 10-9, or 10-10).

This prevents write of data (magnetization switching of the storage layer 11) in the unselected MTJ element 10 even if the write current Iwr2 flows through the conductive layer 20.

As described above, in the second program, by the spin Hall effect and voltage effect, among the plurality of MTJ elements 10 on the conductive layer 20, the magnetization alignment of each of the write target MTJ elements 10-1, 10-3, 10-6, 10-9, and 10-10 is selectively changed from the AP state to the P state, and the magnetization alignment of each of the non-write target MTJ elements 10-2, 10-4, 10-5, 10-7, and 10-8 is maintained in the AP state.

In this embodiment, in the write data DTx obtained by converting the 8-bit data into the 10-bit data, the number of symbols "1" in the write data DTx is set to a value close (substantially equal) to the number of symbols "0".

In this embodiment, the number of symbols "1" and that of symbols "0" in the converted 10-bit write data (data pattern) DTx are almost equal to each other independently of the data pattern (the number of symbols "1" and that of symbols "0") in the 8-bit data DT.

Therefore, the number of selected elements and that of unselected elements in the selected string are equal to the number of symbols "1" and that of symbols "0" in the converted 10-bit write data (data pattern) DTx.

As a result, in the VoCSM 1 according to this embodiment, the current value of the write current Iwr is not set based on the data pattern of the 8-bit data (externally obtained data) DT, and can be set based on the 10-bit data (converted data) DTx in which the number of symbols "1" and that of symbols "0" in the data pattern are substantially equal to each other.

Therefore, in the VoCSM according to this embodiment, the design range of the current value of the write current based on the data DTx after conversion of the number of bits can be made narrower than that based on the data DT before conversion of the number of bits.

For example, in the second program, the number of selected elements is almost equal to the number of unselected elements, and thus the current value of the write current can be set to an almost uniform value independently of the data code of the data DTx.

Note that in the write operation of the VoCSM according to this embodiment, write of "0" data may be executed in the first program and write of "1" data may be executed in the second program.

After supplying the write current, the potentials of the bit lines BL are returned to the initial state. The potential of the word line WL is controlled to set the transistors TR1, TR2, and TR3 in an OFF state. This deactivates the selected string.

For example, the VoCSM according to this embodiment notifies the controller 5 of completion of the write operation using the control signal CNT.

As described above, the write operation of the VoCSM 1 according to this embodiment is completed.

In the VoCSM according to this embodiment, 8-bit data can be converted into 10-bit data, and written in the memory cell string in the memory cell array.

<Read Operation>

The read operation of the VoCSM according to this embodiment will be described with reference to FIG. 17.

Figure 17:
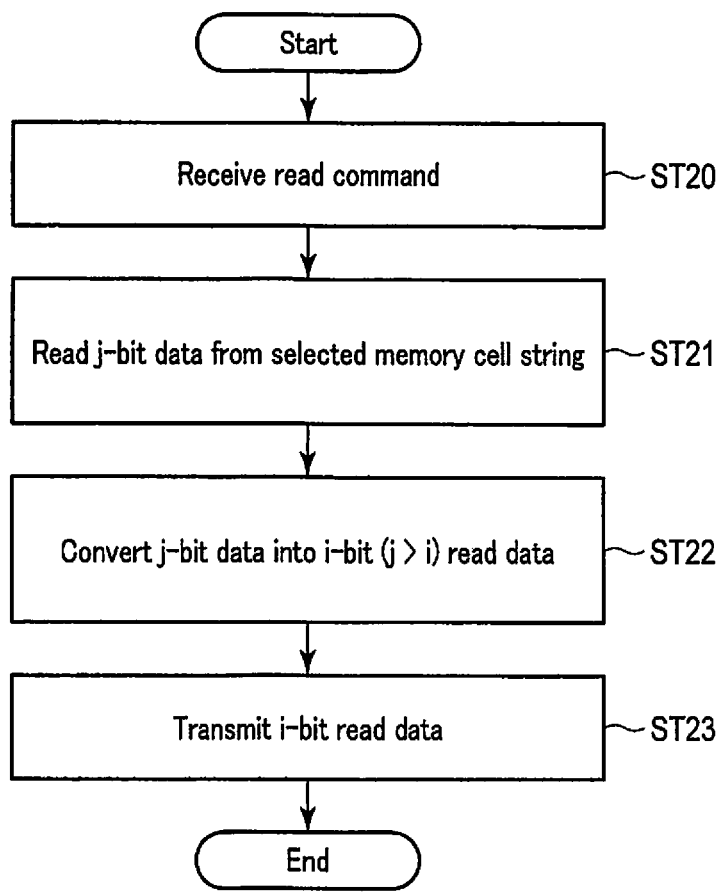

FIG. 17 is a flowchart for explaining the read operation of the VoCSM according to this embodiment.

As shown in FIG. 17, as for the operation of the system including the VoCSM according to this embodiment, the host device 900 requests read of data from the VoCSM 1 according to this embodiment. The host device 900 transmits a read request to the controller 5.

The controller 5 receives the read request. In response to the read request, the controller 5 transmits the read command CMD and the selected address ADR to the VoCSM 1 according to this embodiment.

The VoCSM 1 according to this embodiment receives the read command CMD and the selected address ADR (step ST20).

For example, the selected address ADR is supplied to the decode circuit 130. The selected address ADR is decoded by the decode circuit 130.

The row control circuit 110 activates the word line WL based on the decoding result of the selected address ADR. The column control circuit 120 activates the plurality of bit lines BL based on the decoding result of the selected address ADR.

This selects and activates the memory cell string MS corresponding to the selected address ADR.

The control circuit 190 and the read circuit 150 read the j-bit data (in this example, 10-bit data) of the selected string MS from the memory cell array 100 (step ST21).

The read circuit 150 senses and amplifies the currents or potentials of the bit lines BL connected to the selected string MS. Then, the read circuit 150 reads the 10-bit data DTx from the selected string MS. For example, data of each MTJ element 10 in the selected string is determined using at least one of read methods such as a DC method, a reference cell method, and a self-reference method.

The read circuit 150 transmits, to the control circuit 190, the 10-bit data DTx based on the sense result. After acquiring the sense result, the selected string is deactivated.

In the VoCSM 1 according to this embodiment, the control circuit 190 converts the 10-bit data DTx from the memory cell array 100/read circuit 150 into the 8-bit data DT by the calculation processing of the data conversion circuit 191 or the conversion table (inversion table) in the circuit 191 (step ST22).

The control circuit 190 transmits the converted 8-bit data DT to the controller 5 via the I/O circuit 160 (step ST23).

As described above, the data read operation of the VoCSM according to this embodiment is completed.

In the VoCSM according to this embodiment, data whose number of bits is converted from 8 bits into 10 bits can be read.

(d) Summary

In the magnetic memory according to this embodiment, i-bit data provided from the outside of the magnetic memory is converted into j-bit data, and written in the memory cell array of the magnetic memory.

In this embodiment, conversion of the number of bits and data code of data is executed so that the number of "1"s and that of "0"s in data are almost equal to each other with respect to the data code of data (converted data) to be written in the memory cell array.

Thus, in the magnetic memory according to this embodiment, at the time of the write operation, the current amount of the current flowing between the MTJ elements and the conductive layer is almost constant regardless of the data pattern of the externally obtained write data.

As a result, the design restriction of the write circuit on the magnetic memory according to this embodiment is relaxed.

In addition, in the magnetic memory according to this embodiment, the consumption current of the write current can be reduced by data conversion.

As described above, the memory characteristic of the magnetic memory according to this embodiment can be improved.

(2) Second Embodiment

A magnetic memory and a control method therefore according to the second embodiment will be described with reference to FIGS. 18, 19, and 20.

This embodiment will describe a configuration for reading data from a magnetic memory (for example, a VoCSM) and a control method (read operation) for the configuration.

(a) Configuration Example

Figure 18:
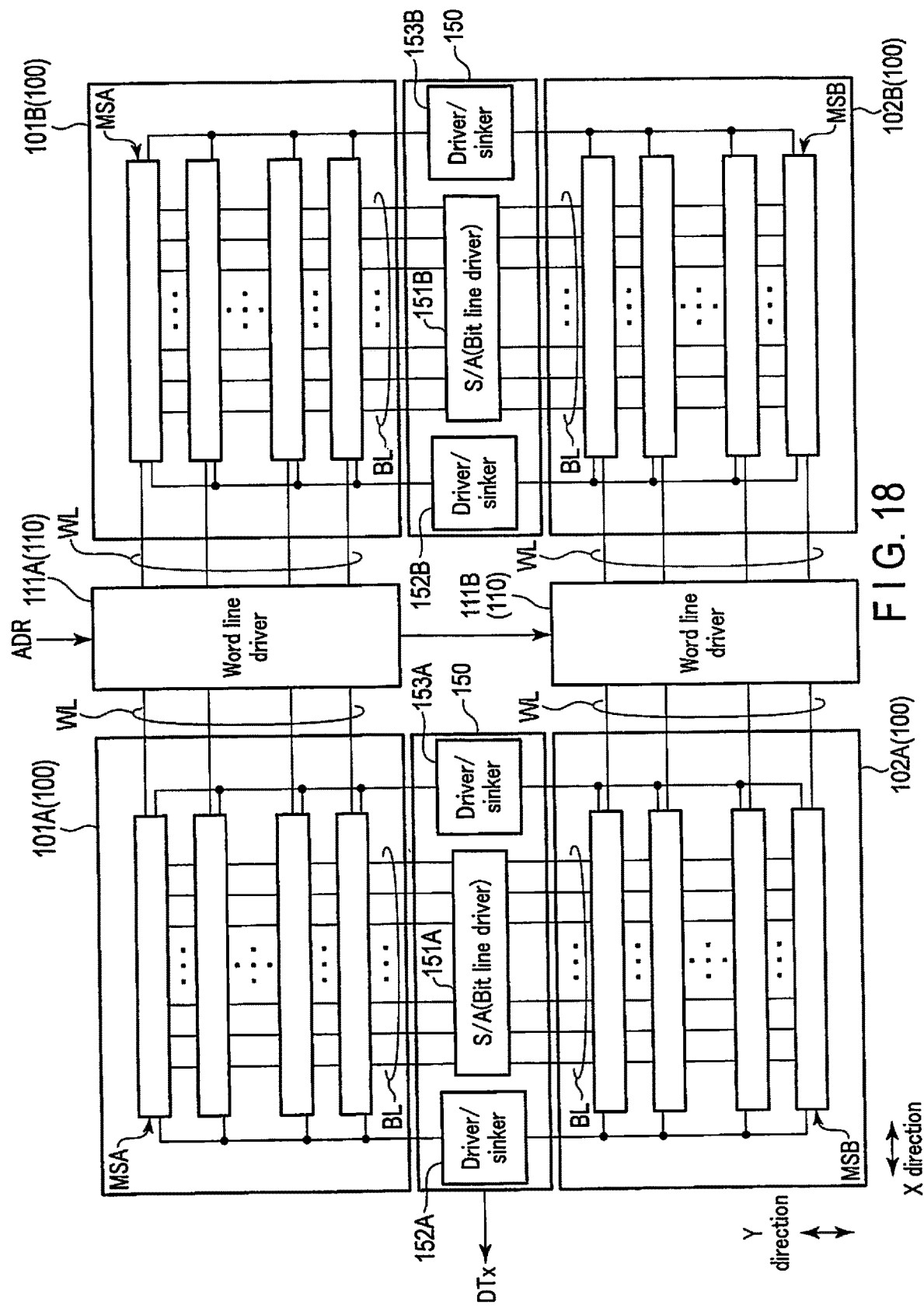
FIGS. 18 and 19 are views for explaining an example of the configuration of a magnetic memory according to the second embodiment.

FIG. 18 is a schematic view for explaining the internal configuration of the VoCSM according to this embodiment.

As shown in FIG. 18, a memory cell array 100 includes a plurality of memory areas (to be referred to as, for example, banks, mats, or segments) 101A, 101B, 102A, and 102B. For example, the memory cell array 100 includes the four memory areas 101A, 101B, 102A, and 102B.

The memory areas 101A and 102A are arranged in the Y direction.

A read circuit 150 (and write circuit 140) is arranged between the two memory areas 101A and 102A. The read circuit 150 includes at least a sense amplifier circuit (and bit line driver) 151A and driver/sinker circuits 152A and 153A.

Similarly, a sense amplifier circuit 151B and driver/sinker circuits 152B and 153B are arranged between the memory areas 101B and 102B arranged in the Y direction.

The driver/sinker circuits 152 and 153 may be shared by the read circuit 150 and the write circuit 140.

The memory areas 101A and 101B are arranged in the X direction.

A word line driver 111A of a row control circuit 110 is arranged between the two memory areas 101A and 101B.

Similarly, a word line driver 111E is arranged between the memory areas 102A and 102B arranged in the X direction.

For the sake of descriptive clarity, as for the two memory areas connected to the common sense amplifier circuit 151 (151A or 151B), a memory cell string in one memory area 101 (101A or 101B) will be referred to as a memory cell string MSA hereinafter and a memory cell string in the other memory area 102 (102A or 102B) will be referred to as a memory cell string MSB hereinafter.

As in the above-described embodiment, the VoCSM according to this embodiment converts externally obtained i-bit data DT into j-bit data DTx. The VoCSM according to this embodiment stores the j-bit data. In the converted j-bit data DTx, the number of "1"s is almost equal to that of "0"s.

Each of the memory cell strings MSA and MSB includes j (for example, 10) MTJ elements 10.

At the time of read of data from a VoCSM 1 according to this embodiment, the memory cell string in one of the two memory areas 101 and 102 sharing the sense amplifier circuit 151 is activated as a data read target, and the memory cell string in the other memory area is activated to generate a reference value (reference current or reference potential).

The memory cell string (read target memory cell string) selected based on a selected address ADR will be referred to as a selected string hereinafter, and the memory cell string for generating a reference value will be referred to as a reference string hereinafter. Out of the two memory areas 101 and 102, the memory area including the selected string will be referred to as a selected area hereinafter, and the memory area including the reference string will be referred to as an unselected area (or reference area) hereinafter.

A row address in the selected address ADR includes an address value (for example, several upper bits of the row address) ADa indicating the memory area 101 or 102 and an address value (for example, several lower bits of the row address) ADb indicating a word line WL.

For example, an address value ADb<x> of the word line to which the reference string is connected is equal to an address value ADb<x> of the word line to which the selected string is connected. The address value ADa (for example, an address value ADa<1>) of the memory area of the selected string is different from the address value ADa (for example, an address value ADa<2>) of the memory area of the reference string.

Figure 19:
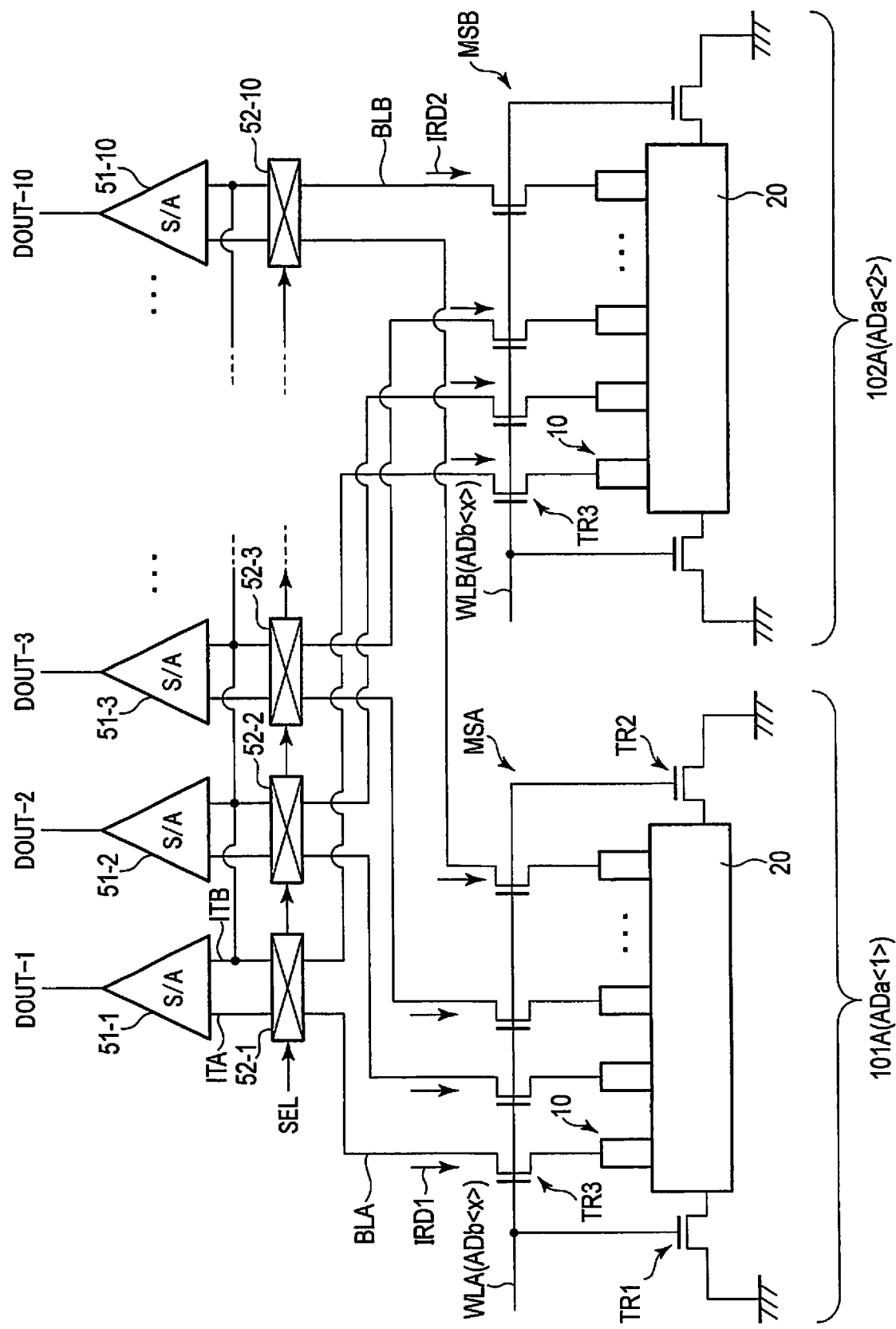

FIG. 19 is a view showing an example of the configuration of the read circuit in the VoCSM according to this embodiment.

As shown in FIG. 19, the sense amplifier circuit 151 includes a plurality of sense amplifier units 51 (51-1, 51-2, 51-3, ..., 51-10) and a plurality of selectors (switch circuits) 52 (52-1, 52-2, 52-3, ..., 52-10).

The number of sense amplifier units 51 and that of selectors 52 corresponding to one memory cell string MS are equal to the number of MTJ elements 10 in the memory cell string MS. For example, if the memory cell string MS includes the 10 MTJ elements 10, the number of sense amplifier units 51 and that of selectors 52 are 10.

The selectors 52 and the sense amplifier units 51 have a one-to-one correspondence.

Each sense amplifier unit 51 includes a first input terminal (sense terminal) ITA and a second input terminal (reference terminal) ITB. The first input terminal ITA serves as an input terminal of a signal (for example, a cell current or cell potential) from the corresponding MTJ element 10 of the selected string MS and the second input terminal ITB serves as an input terminal of a signal (for example, a reference current or reference potential) from the reference string MS.

In the plurality of sense amplifier units 51, the plurality of second input terminals ITB are commonly connected. At the time of the read operation, the plurality of MTJ elements 10 of the reference string are connected in parallel to a node connected to the common second input terminals ITB. A resistance value caused by the plurality of MTJ elements 10 connected to the node can take a value (for example, an averaged value) obtained by connecting, in parallel, the plurality of MTJ elements 10 having given resistance values.

For example, according to this embodiment, in the data in the memory cell string, the number of "1"s (MTJ elements in the AP state) is almost equal to that of "0"s (MTJ elements in the P state). Therefore, the potential of the node of the common second input terminals ITB has a potential corresponding to a resistance value between a resistance value Rap of the MTJ element 10 in the AP state and a resistance value Rp of the MTJ element 10 in the P state.

The first and second input terminals ITA and ITB are connected to the corresponding selector 52.

The first input terminal ITA is connected to the first output terminal of the corresponding selector 52, and the second input terminal ITB is connected to the second output terminal of the corresponding selector 52.

The first input terminal of the selector 52 is connected to a corresponding bit line BLA in the memory cell string MSA in the first memory area 101. The second input terminal of the selector 52 is connected to a corresponding bit line BLB in the memory cell string MSB in the second memory area 102.

A selection signal SEL is supplied to the control terminal of each selector 52.

Based on the selection signal SEL, each selector 52 connects one of the bit lines BLA and BLB to the first input terminal ITA of the corresponding sense amplifier unit 51, and connects the other one of the bit lines BLA and BLB to the second input terminal ITB of the corresponding sense amplifier unit 51.

For example, the control circuit 190 controls the signal level of the selection signal SEL based on the selected address ADR. This causes the selectors 52 to connect the bit lines BL of the memory cell string MS of the selected area to the first input terminals ITA, and connect the bit lines BL of the memory cell string MS of the reference area (unselected area) to the second input terminals ITB.

At the time of the read operation, in the memory cell string MSA, a read current IRD1 flows through each bit line BLA. The current value of the read current IRD1 is a value corresponding to the resistance value of the corresponding MTJ element (the magnetization alignment of the MTJ element 10). In the memory cell string MSB, a read current IRD2 flows through each bit line BLB. The current value of the read current IRD2 is a value corresponding to the resistance value of the corresponding MTJ element 10.

A signal (current/potential) corresponding to the read current IRD (IRD1 or IRD2) is supplied to the input terminal ITA or ITB of the sense amplifier unit 51.

Each sense amplifier unit 51 senses and amplifies the signal supplied to the first input terminal ITA and the signal supplied to the second input terminal ITB.

The sense amplifier units 51 respectively output signals DOUT-1, DOUT-2, DOUT-3, . . . , DOUT-10 based on the sense results. Each sense amplifier unit 51 outputs, as a signal DOUT, a signal corresponding to "1" data or a signal corresponding to "0" data in accordance with the magnitude relationship between the two sensed signals.

Note that in accordance with a data write status in the VoCSM, data may not be written in the memory cell string to be activated as a reference string based on the selected address. In this case, with reference to a management table of the controller 5 at the time of generation of a write command, an arbitrary memory cell string (for example, a memory cell string for generation of a reference value or a memory cell string having an approximate value of the word line address of the selected address) may be selected and activated as a reference string.

In the initial state (for example, a state at the time of shipping of the magnetic memory or a state at the time of power-on of the system) of the memory cell string, data (dummy data) in which the number of "1"s and that of "0"s are almost equal to each other may be written in the memory cell string.

(b) Operation Example

As described above with reference to FIG. 17, at the time of read of data, based on a request from a host device 900, the controller 5 transmits a read command and the selected address ADR to the VoCSM according to this embodiment.

Thus, the VoCSM according to this embodiment executes the read operation.

The VoCSM according to this embodiment activates the selected memory area and selected memory cell string based on the selected address ADR. Together with this, the VoCSM according to this embodiment activates the reference string for generating a reference value.

At the time of the read operation of the VoCSM according to this embodiment, if the memory cell string MSA in the memory area 101A is selected, the memory cell string MSB in the memory area 102A is used as a reference string.

For example, the address value ADb<x> of the word line WLB of the reference string MSB is equal to the address value ADa<x> of the word line WLA of the selected string MSA. Thus, in the two memory areas 101A and 102A, the memory cell string MSB at a position symmetric to that of the selected string MSA with respect to the row address is selected as a reference string.

Based on the selection signal SEL, the selectors 52 connect the bit lines BLA of the selected string MSA to the first input terminals ITA of the sense amplifier units 51, and connect the bit lines BLB of the reference string MSB to the second input terminals ITB of the sense amplifier units 51.

In the plurality of sense amplifier units 51, the plurality of second input terminals ITB are commonly connected. Therefore, a reference value (reference signal) for determining data is commonly supplied to the plurality of second input terminals ITB. The reference value is a signal (potential) corresponding to a combined resistance value (for example, a resistance value between the resistance value of the MTJ element in the AP state and that of the MTJ element in the P state) formed from the plurality of MTJ elements of the reference cell string.

Each sense amplifier unit 51 senses and amplifies the signal supplied to the first input terminal ITA and the signal supplied to the second input terminal ITB. Each sense amplifier unit 51 determines data held in the corresponding MTJ element 10 in the selected string MSA based on the sensed two signals (for example, based on a result of comparison of the magnitudes of the two signals).

This causes each sense amplifier unit 51 to output the signal ("0" or "1") DOUT associated with the data held in the corresponding MTJ element 10.

If the memory cell string. MSB in the memory area 102A is selected, the memory cell string MSA in the memory area 101A is used as a reference string.

Based on the selection signal SEL, the selectors 52 connect the bit lines BLB of the selected string MSB to the first input terminals ITA of the sense amplifier units 51, and connect the bit lines BLA of the reference string MSA to the second input terminals ITB of the sense amplifier units 51.

Each sense amplifier unit 51 determines data held in the corresponding MTJ element 10 in the selected string MSB based on the signal of the first input terminal ITA and that of the second input terminal ITB.

This causes each sense amplifier unit 51 to output the signal DOUT associated with the data held in the corresponding MTJ element 10.

As described above, the read circuit 150 transmits, to the control circuit 190, the 10-bit data DTx read from the selected string. The control circuit 190 converts the 10-bit data DTx into the 8-bit data DT.

The 8-bit data DT is transmitted from the VoCSM of this embodiment to the controller 5 via a data bus (for example, eight data lines) with an 8-bit data width.

As described above, the data read operation of the VoCSM according to this embodiment is completed.

(c) Summary

Figure 20:
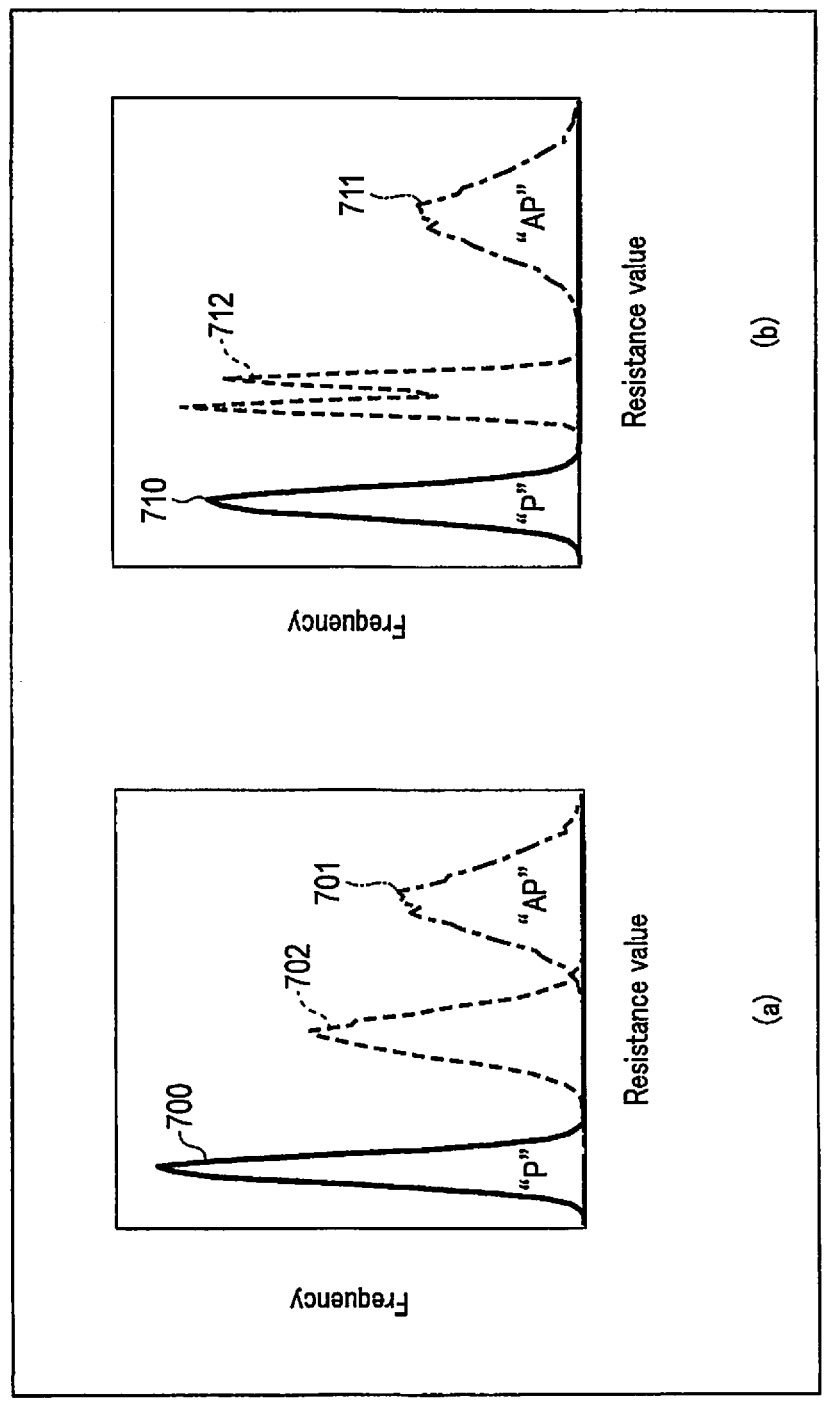
FIG. 20 shows graphs for explaining the magnetic memory according to the second embodiment.

FIG. 20 shows graphs for explaining the effect of the read method of the VoCSM according to this embodiment.

In FIG. 20, (a) shows the distribution of the resistance values of the MTJ elements in the AP state, the distribution of the resistance values of the MTJ elements in the P state, and the distribution of the reference resistance values in the general read method of the magnetic memory.

In FIG. 20, (b) shows the distribution of the resistance values of the MTJ elements in the AP state, the distribution of the resistance values of the MTJ elements in the P state, and the distribution of the reference resistance values when 8-bit data are converted into 10-bit data in the read method of the magnetic memory according to this embodiment.

In (a) and (b) of FIG. 20, the abscissa corresponds to the resistance value and the ordinate corresponds to a frequency (existence probability).

As shown in (a) of FIG. 20, a distribution 702 of the reference resistance values is provided between a distribution 700 of the resistance values Rp of the MTJ elements in the P state and a distribution 701 of the resistance values Rap of the MTJ elements in the AP state to determine the data of the MTJ elements in the general read method of the magnetic memory.

The distributions. 700 and 701 spread to some extent due to variations in characteristics of the MTJ elements.

Since the elements (for example, the MTJ elements) for forming the reference resistance values have variations in characteristics (resistance values), the distribution 702 spreads to some extent, similarly to the distributions 700 and 701.

If the spread of the distribution 702 is large, the distribution 702 of the reference resistance values may overlap the distribution 700 of the resistance values Rp of the MTJ elements and/or the distribution 701 of the resistance values Rap of the MTJ elements. In the example shown in (a) of FIG. 20, the tail of the distribution 702 of the reference resistance values overlaps the distribution of the resistance values Rap.

In this case, an error may occur in read of data from the magnetic memory.

In this embodiment, in the plurality of memory cell strings that can be reference strings, the number of MTJ elements in the AP state in each memory cell string is almost constant, thereby making it possible to reduce variations in reference resistance values.

Therefore, as shown in (b) of FIG. 20, the spread of the tail of a distribution 712 of the reference resistance values in this embodiment is smaller than the spread of the tail of the distribution 702 of the reference resistance values in (a) of FIG. 20.

Note that as described above, 8-bit write data is converted into a 10-bit data code including five "1"s or a 10-bit data code including six "1"s. Thus, in the distribution 712 of the reference resistance values obtained from the memory cell strings (reference strings) holding the converted data codes, two peaks are generated in accordance with the reference string storing the data codes each including five "1"s and that storing the data codes each including six "1"s.

Therefore, the read method of the magnetic memory according to this embodiment can increase an interval between the distribution 712 of the reference resistance values and a distribution 702 of the resistance values Rp of the MTJ elements in the P state and an interval between the distribution 712 of the reference resistance values and a distribution 711 of the resistance values Rap of the MTJ elements in the AP state.

As a result, it is possible to suppress the distribution 712 of the reference resistance values from overlapping the distributions 710 and 711 of the resistance values of the MTJ elements.

As described above, in this embodiment, a reference value for read of data is generated using the combined resistance of the plurality of MTJ elements of the memory cell string. The same reference value is supplied to the plurality of sense amplifier units connected to the selected string.

Therefore, the magnetic memory according to this embodiment can decrease variations in reference values.

In this embodiment, the reference string is selected and activated so that the reference string and the selected string exist at positions symmetric to each other with respect to the sense amplifier circuit.

Thus, the magnetic memory according to this embodiment can suppress the influence of a parasitic component caused by dependency of the physical arrangement of the selected string and reference string in the memory cell array.

As a result, the magnetic memory according to this embodiment can ensure a relatively large read margin, and improve the read error rate.

Therefore, the data read reliability of the VoCSM according to this embodiment can be improved.

Furthermore, the magnetic memory according to this embodiment need not be provided with a reference cell for generating a reference value separately from a memory cell. Thus, the magnetic memory according to this embodiment can suppress an increase in circuit area caused by installation of a reference cell.

As described above, the memory characteristic of the magnetic memory according to this embodiment can be improved.

(3) Third Embodiment

A magnetic memory and a control method therefor according to the third embodiment will be described with reference to FIG. 21.

Figure 21:
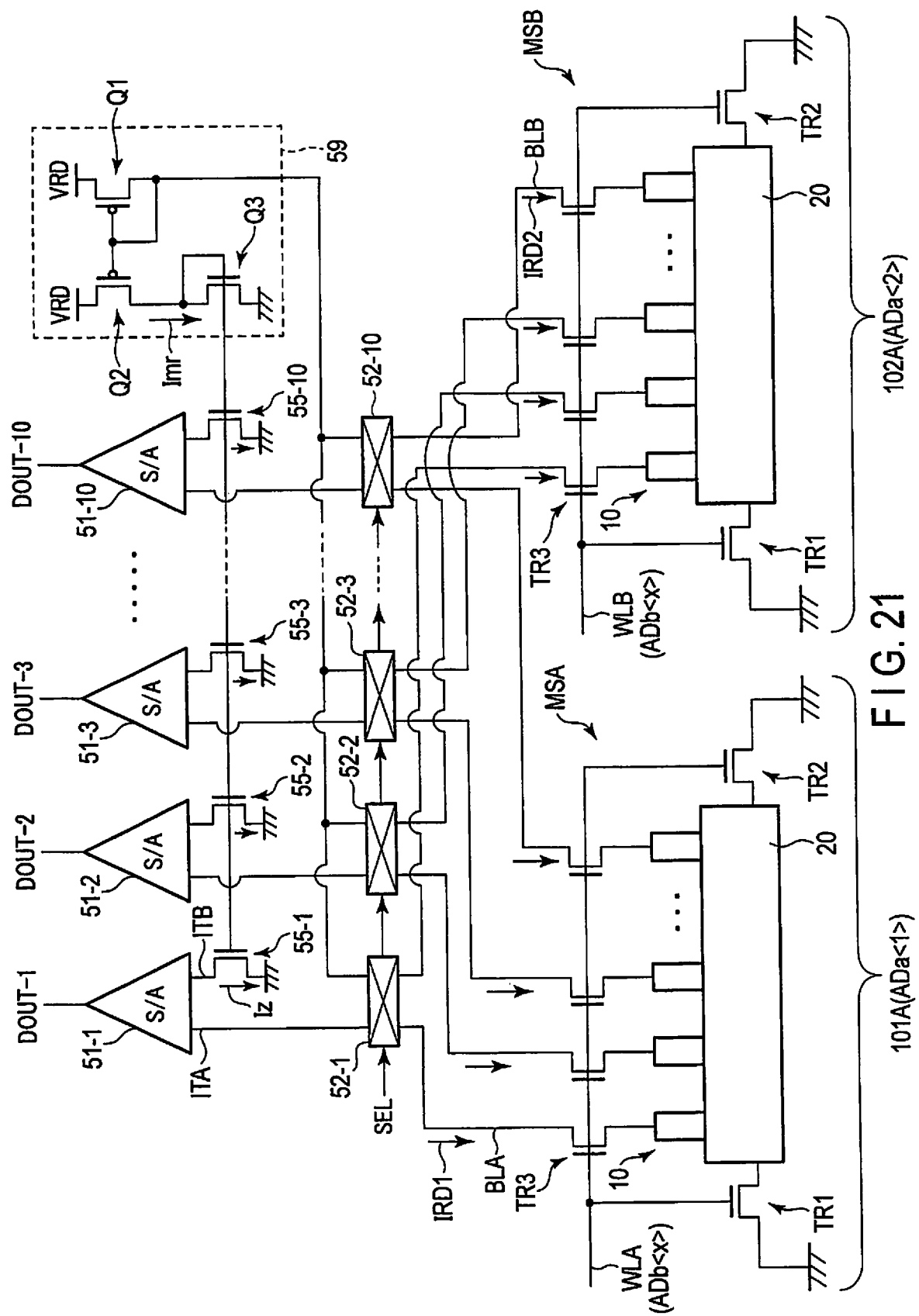
FIG. 21 is a schematic view for explaining a magnetic memory according to the third embodiment.

FIG. 21 is a view for explaining the configuration of the read circuit of the magnetic memory (for example, a VoCSM or MRAM) according to this embodiment.

As shown in FIG. 21, in the VoCSM according to this embodiment, a read circuit 150 includes a current mirror circuit 59.

At the time of a read operation, in a plurality of sense amplifier units 51 in the read circuit 150, second input terminals (reference terminals) ITB are connected to a reference string and the output terminals of selectors 52 via the current mirror circuit 59.

The current mirror circuit 59 includes transistors Q1, Q2, and Q3.

One end (one of the source/drains) of the current path of the p-type transistor Q1 is commonly connected to the second output terminals of the plurality of selectors 52. The one end of the current path of the transistor Q1 is connected to the gate of the transistor Q1. The other end (the other one of the source/drains) of the current path of the transistor Q1 is connected to a voltage terminal VRD. A voltage VRD is applied to the voltage terminal VRD.

One end of the current path of the p-type transistor Q2 is connected to one end of the current path of the n-type transistor Q3. The other end of the current path of the transistor Q2 is connected to the voltage terminal VRD.

The gate of the transistor Q2 is connected to the gate and one end of the current path of the transistor Q1.

The one end of the current path of the n-type transistor Q3 is connected to the one end of the current path of the transistor Q2, and is also connected to the gate of the transistor Q3. The other end of the current path of the transistor Q3 is grounded.

In the current mirror circuit 59, the transistor Q2 outputs a current Imr. The current value of the current Imr corresponds to the magnitudes of currents IRD (IRD1 and IRD2) and the mirror ratio (gate-size ratio) of the two transistors Q1 and Q2.

In each sense amplifier unit 51, one end of the current path of a transistor 55 (55-1, 55-2, 55-3, . . . , 55-10) is connected to the second input terminal of the sense amplifier unit 51, and the other end of the current path of the transistor 55 is grounded.

The gates of the plurality of transistors 55 are commonly connected to the gate of the transistor Q3 of the current mirror circuit 59.

As a result, each transistor 55 outputs a reference current (drain current) Iz by a driving force corresponding to the mirror ratio between the transistors 55 and Q3 and the current Imr of the current mirror circuit 59.

In accordance with the circuit configuration of the read circuit/sense amplifier circuit, a large difference may occur between the reference value of the MTJ element 10 in the reference string and the sensed value of the MTJ element in the selected string, or the interference of an operation (current) between the plurality of sense amplifier units may occur.

In this embodiment, as shown in FIG. 21, the current mirror circuit 59 distributes a current corresponding to the current of each MTJ element of the reference string to each sense amplifier unit 51.

This allows the VoCSM of this embodiment to suppress the excessive difference between the reference current and sensed current and/or the interference of the operation between the sense amplifier units.

In addition, the VoCSM of this embodiment can control the magnitude of the reference current Iz supplied to each sense amplifier unit 51 by adjusting the mirror ratio of the current mirror circuit.

Therefore, the data read accuracy of the magnetic memory according to this embodiment can be improved.

As described above, the memory operation characteristic of the magnetic memory according to the third embodiment can be improved.

(4) Fourth Embodiment

A magnetic memory and a control method therefor according to the fourth embodiment will be described with reference to FIGS. 22, 23, 24, 25, and 26.

According to the first embodiment, an example in which write data is converted from 8 bits into 10 bits has been explained.

In this embodiment, write data is converted from 8 bits into 11 bits.

Figure 22:
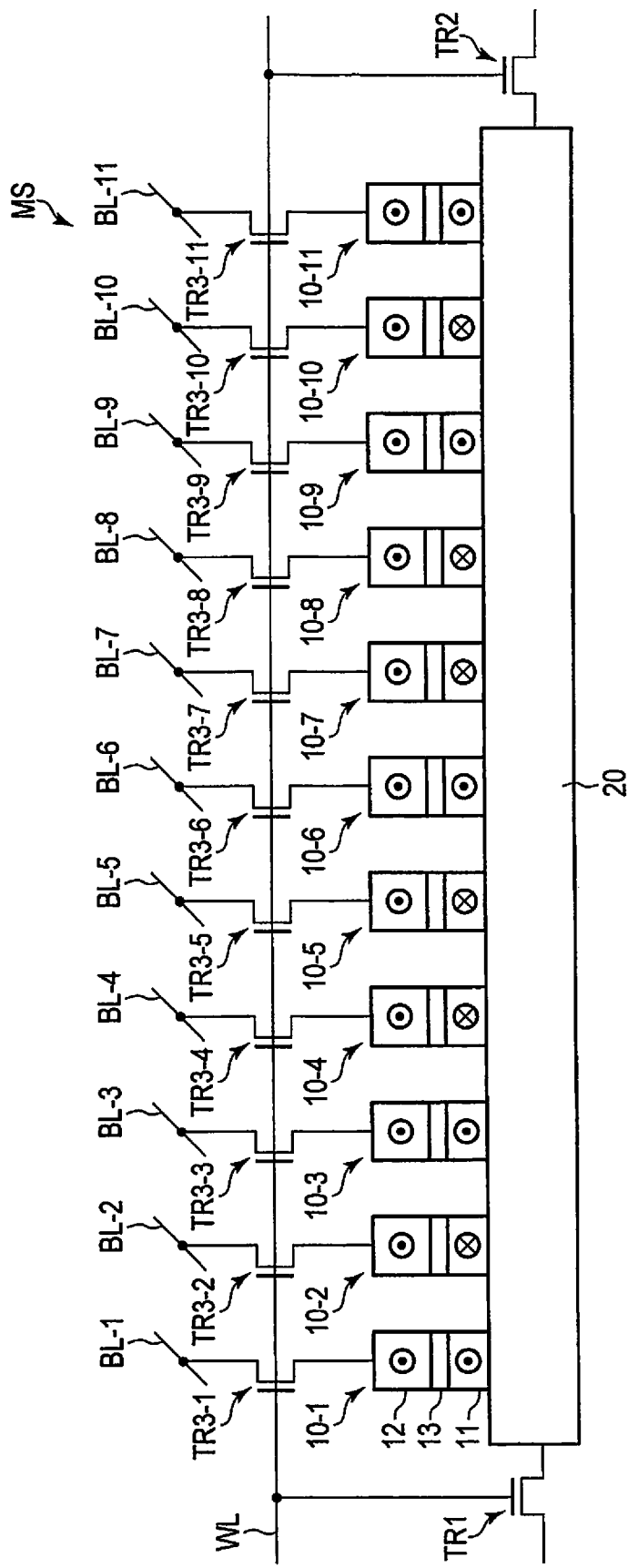
FIG. 22 is a view for explaining an example of the configuration of a magnetic memory according to the fourth embodiment.

FIG. 22 is a schematic sectional view showing an example of the configuration of a memory cell string in the magnetic memory (for example, a VoCSM) according to this embodiment.

As shown in FIG. 22, when 8-bit data is converted into 11-bit data, one memory cell string MS includes 11 memory cells (MTJ elements) 10.

In this embodiment, the data code of 8-bit data DT is converted into 11-bit data code including six "1"s.

FIG. 23 is a schematic view for explaining data conversion in the VoCSM according to this embodiment.

In a data space represented by 11 bits, there exist 462 data codes (data) 591 (DTx) each including six "1"s.

Thus, each of 256 data codes 501 of 8-bit data DT is converted into a corresponding one of the 462 data codes 591 of 11-bit data DTx.

FIG. 24 is a table showing an example of mapping (conversion table) for converting 8-bit data into 11-bit data.

As shown in FIG. 24, each of the 11-bit data codes used for conversion between 8-bit data and 11-bit data includes six "1"s.

For example, an 8-bit data code 501a of "00000000" is converted into an 11-bit data code 591a of "00000111111".

An 8-bit data code 501b of "00010001" is converted into an 11-bit data code 591b of "00011011110".

An 8-bit data code 501c of "00011110" is converted into an 11-bit data code 591c of "00100110111".

As shown in the data conversion table of FIG. 24, each 8-bit data is mapped on the data space of 11 bits including six "1"s.

Note that with respect to conversion from 8-bit data into 11-bit data, 8-bit data code may be converted into data codes (number of codes=330) each including four "1"s, data codes (number of codes=462) each including five "1"s, or data codes (number of codes=330) each including seven "1"s.

However, the number (m) of "1"s in the converted data preferably satisfies inequality (B) above.

Figure 25:
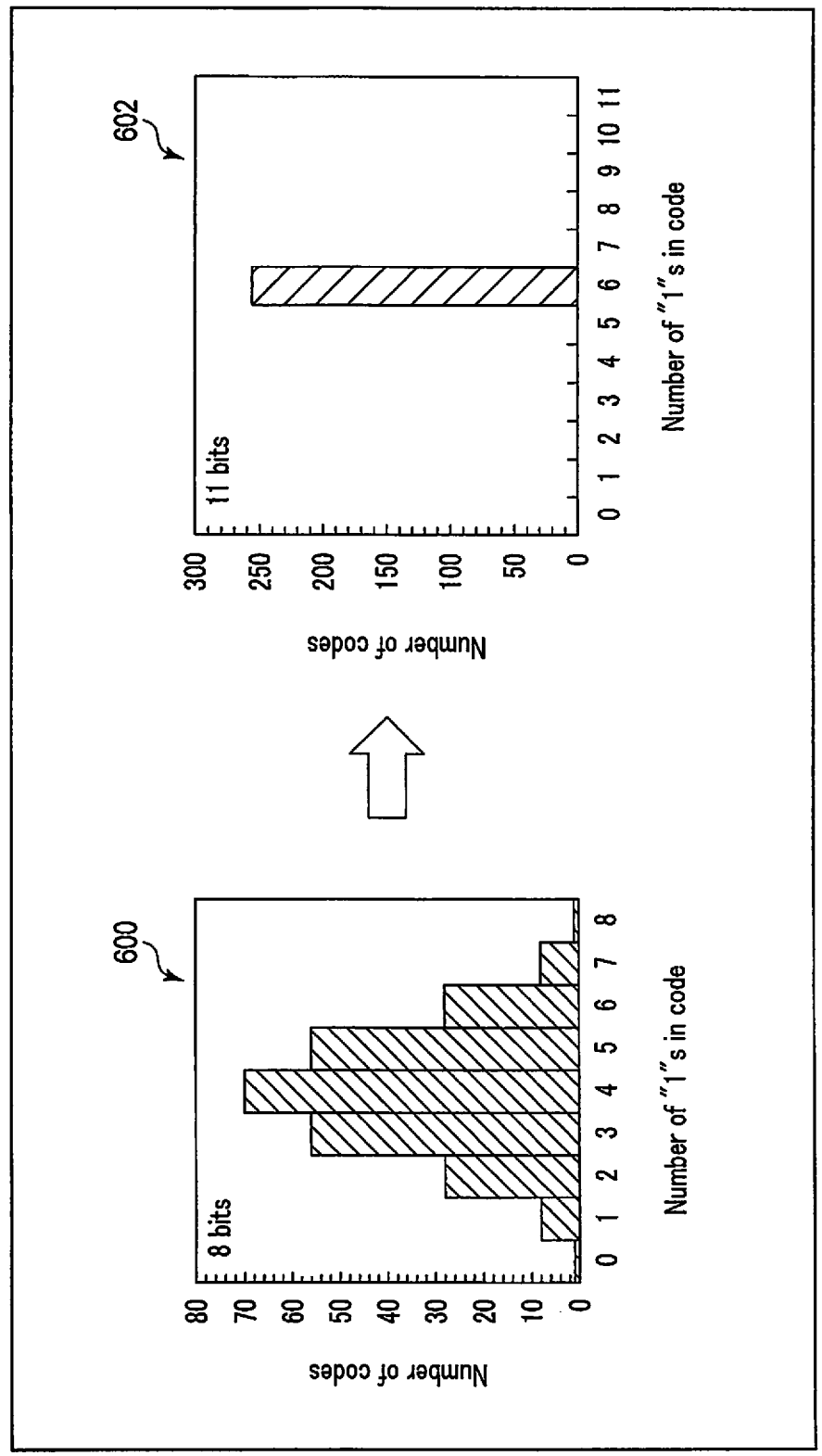

FIG. 25 shows graphs of the distributions of the numbers of symbols "1" in data before and after conversion of the number of bits in the VoCSM according to this embodiment.

In each of the graphs shown in FIG. 25, the abscissa corresponds to the number of "1"s in a data code, and the ordinate corresponds to the number of data codes for each number of "1"s.

As shown in FIG. 25, according to this embodiment, the number of "1"s (and the number of "0"s) in the data code of the converted data can be made constant by increasing the number of bits of the converted data.

Figure 26:
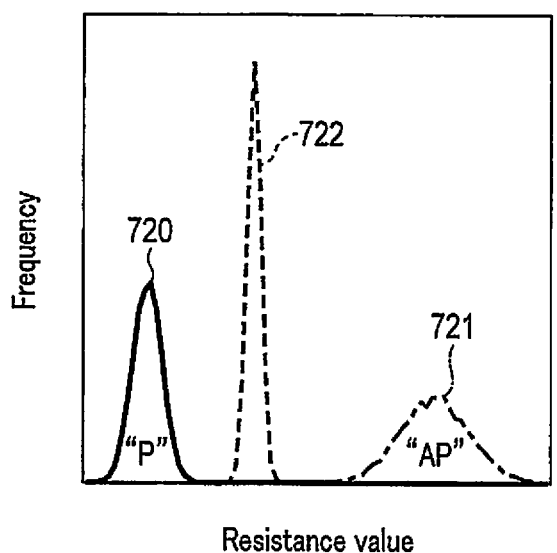

FIG. 26 shows the distribution of the resistance values of the MTJ elements in the AP state, the distribution of the resistance values of the MTJ elements in the P state, and the distribution of the reference resistance values when 8-bit data are converted into 11-bit data in the read method of the VoCSM according to this embodiment.

In FIG. 26, the abscissa corresponds to the resistance value and the ordinate corresponds to a frequency (existence probability).

As shown in FIG. 26, a distribution 722 of the reference resistance values is provided between a distribution 720 of resistance values Rp and a distribution 721 of resistance values Rap.

By making the number of "1"s (the number of MTJ elements in AP state) in an 11-bit data code constant as in this embodiment, the spread of the tail of the distribution 722 of the reference resistance values according to this embodiment is further made smaller than the spreads of the tails of the distributions of the reference resistance values of the examples in (a) and (b) of FIG. 20.

Therefore, the read method of the magnetic memory according to this embodiment can further increase an interval between the distribution 722 of the reference resistance values and the distribution 720 of the resistance values Rp and an interval between the distribution 722 of the reference resistance values and the distribution 721 of the resistance values Rap.

As a result, the VoCSM according to this embodiment can improve the read margin.

Therefore, the data read accuracy of the VoCSM according to this embodiment can be improved.

As described above, the memory characteristic of the magnetic memory according to the fourth embodiment can be improved.

(5) Fifth Embodiment

A magnetic memory and a control method therefor according to the fifth embodiment will be described with reference to FIGS. 27, 28, 29, 30, 31 and 32.

FIG. 27 is a schematic view for explaining a magnetic memory (for example, a VoCSM) according to this embodiment.

As shown in FIG. 27, at the time of the write operation of the VoCSM, a control voltage VCNT is applied to the MTJ elements 10. There is a possibility that, depending on the voltage value of the control voltage VCNT, a current could flow between each MTJ element 10 and the conductive layer 20.

If, in the write operation, the MTJ voltage VCNT of a positive, voltage value Vd (or 0V) is applied to the MTJ element 10, a current Id flows, for example, from the MTJ element 10 to the conductive layer 20. If the MTJ voltage VCNT of a negative voltage value Va is applied to the MTJ element 10, a current Ia flows, for example, from the conductive layer 20 to the MTJ element 10.

As such, attributable to the current Ia or Id flowing between the MTJ element 10 applied with the control voltage VCNT (Va or Vd) and the conductive layer 20 in the write operation (hereinafter, such a current will be referred to as an MTJ current $I_{MTJ}$), the current value of the write current Iwr could deviate from its set value (initial value) Ix at portions in the conductive layer 20.

Note that the magnitude of the current value Ia could differ from the magnitude of the current value Id depending on an MR ratio of the MTJ element (ratio between the resistance value of the high-resistance state MTJ element and the resistance value of the low-resistance state MTJ element) and/or the resistance state (P/AP state) of the MTJ element.

For example, it will be supposed that a single memory cell string MS as a target of the write operation includes selected or unselected MTJ elements consecutively arranged on the conductive layer 20 based on converted data to be written. In such instances, the write current tends to undergo an increased variation from the initial value (set value) Ix in accordance with the number of consecutive selected MTJ elements or the number of consecutive unselected MTJ elements.

As for the exemplary memory cell string that includes 10 MTJ elements 10 arranged on the conductive layer 20 as described above, if this memory cell string includes selected (or unselected) MTJ elements 10 consecutively arranged based on converted data to be written, the current value of the write current Iwr varies by the degree of about $3 \times I_{MTJ}$ to $6 \times I_{MTJ}$ with respect to the initial value Ix at the portions of the conductive layer 20 that correspond to the consecutive selected (or unselected) MTJ elements.

As one example of this, if there are selected MTJ elements 10 consecutively arranged on the conductive layer 20, the current value of the write current Iwr at the portions of the conductive layer 20 that correspond to the consecutive MTJ elements 10 becomes a value ranging from about $Ix+3 \times I_{MTJ}$ to about $Ix+5 \times I_{MTJ}$. As another example, if there are unselected MTJ elements 10 consecutively arranged on the conductive layer 20, the current value of the write current Iwr at the portions of the conductive layer 20 that correspond to the consecutive MTJ elements 10 becomes a value ranging from about $Ix+3 \times I_{MTJ}$ to about $Ix-5 \times I_{MTJ}$.

In order to suppress the variations of the write current Iwr in the conductive layer 20 due to the MTJ current $I_{MTJ}$ (Ia, Id) (that is, in order to lower the maximum value of variations of the write current Iwr), it is desirable to select the converted data Dz so that the number of consecutive selected or unselected MTJ elements on the conductive layer 20 will be a predetermined number or less. Accordingly, it is desirable that the number of consecutive "0"s or "1"s in the converted data Dz (e.g., 10-bit data or 11-bit data) will be a predetermined number or less.

For example, supposing that write data is converted into 10-bit or 11-bit data, the number of consecutive selected MTJ elements or the number of consecutive unselected MTJ elements on the same conductive layer 20 (the number of consecutive "0"s or "1"s in the data code of the converted data) should be 4 or less (preferably 3 or less). However, when i-bit data is converted to j-bit data, the number of consecutive selected MTJ elements and/or or the number of consecutive unselected MTJ elements in the j-bit data may be a value (natural number) less than j/2−1.

FIG. 28 is a graph for explaining the VoCSM according to this embodiment.

FIG. 28 shows the results of simulating the relationship between the variation of the write current and data patterns. The simulation results given in FIG. 28 concern the write operations of the VoCSM when converting 8-bit data into 10-bit data.

In FIG. 28, the horizontal axis of the graph represents a normalized value, Imax/Ip, based on the maximum value Imax of variations of the write current Iwr and the current value Ip, and the vertical axis of the graph represents the number of data patterns corresponding to the normalized value. The "Imax" takes an absolute value. The "Ip" indicates a current value of the MTJ current that is occurred due to the selected P-state MTJ elements upon supply of the write current to the conductive layer. In this illustrating example, the current value Ip corresponding to the resistance value of the P-state MTJ element will be adopted as a reference for verifying the tolerable value of variations of the write current.

FIG. 28 gives simulation results for the respective cases of the MR ratio of the MTJ element being 100%, 200%, and 300%. By way of example, the figure also gives the result for the case of the MR ratio of the MTJ element being 0%.

Depending on the MR ratio of the MTJ element 10, the current value of a current flowing through the P-state MTJ element could differ from the current value of a current flowing through the AP-state MTJ element. For the MTJ current $I_{MTJ}$, similarly, depending on the MR ratio of the MTJ element 10, the magnitude of the current value Ia could differ from the magnitude of the current value Id.

As such, variations of the write current Iwr, as well as their maximum value, could differ according to the MR ratio of the MTJ element 10.

As shown in FIG. 28, the number of data codes available for use in the data conversion from 8-bit data into 10-bit data changes according to the value Imax/IP.

The number of data codes in the case of 8 bits is 256. Accordingly, the purpose would be served if the number of data codes based on 10-bit data, used for data conversion, is 256 or greater. Note that 10-bit data gives 1024 data codes.

Therefore, in the instances where the MR ratio of the MTJ element is from 0% to 300%, 8-bit data can be converted into 10-bit data if the value Imax/Ip is about 2.

This means that, when a design value (tolerable value) of the variation of the write current Iwr is set based on the value Imax/Ip, it is possible to keep the normalized maximum value of variations of the write current (in other words, a value substantially equal to Imax/Ip) 2 or lower according to the MR ratio of the MTJ element.

In this context, the maximum value Imax of variations of the write current Iwr in the conductive layer 20 is "2×Ip".

Therefore, a conversion table for 8-bit data into 10-bit data can be prepared using the data patterns that yield the tolerable value Imax/Ip of 2 or lower for variations of the write current, as shown in FIG. 28.

Figure 29:
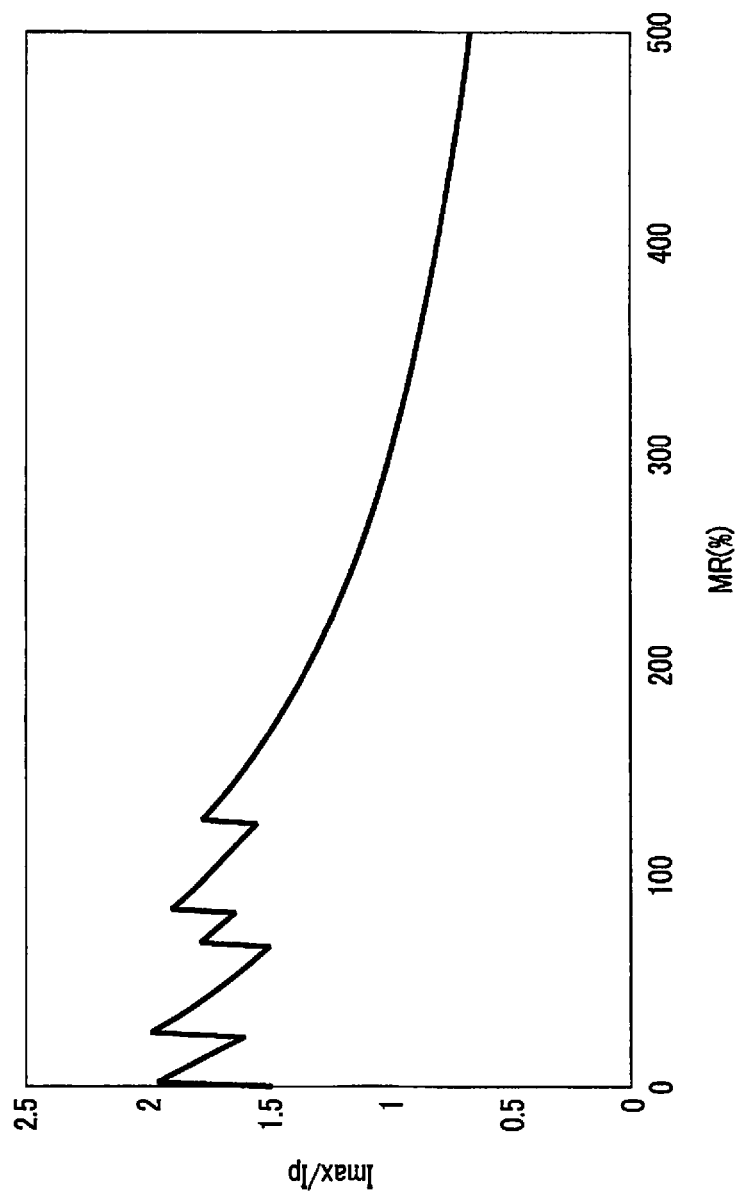

FIG. 29 is a graph showing a relationship between the MR ratio of a magnetoresistive effect element and variations of the write current in the VoCSM according to this embodiment.

FIG. 29 shows the results of simulating the changes of the maximum value of variations of the write current according to the MR ratio of the magnetoresistive effect element (e.g., MTJ element). The simulation results given in FIG. 29 concern the write operations of the VoCSM when converting 8-bit data into 10-bit data.

In FIG. 29, the horizontal axis of the graph represents the MR ratio of the magnetoresistive effect element (e.g., MTJ element), and the vertical axis of the graph represents a normalized value, Imax/Ip, based on the maximum value Imax of variations of the write current and the current value Ip. The plotted line means the conditions which can use 256 codes in 10-bit data. Therefore, it is possible to convert the 8-bit data to 10-bit data in the condition of upper region than the line.

As shown in FIG. 29, use of the converted data having a predetermined number of consecutive "0"s or "1"s (number of consecutive selected or unselected MTJ elements) for executing a data write operation allows the value "Imax/Ip" to be kept 2 or lower, even if the MR ratio of the MTJ element changes.

For example, as the MR ratio of the MTJ element 10 increases, the value Imax/Ip decreases further from 2. In the example of FIG. 29, when the MR ratio of the MTJ element 10 is 500%, the value Imax/Ip is less than 1 and larger than 0.5 (e.g., about 0.6).

Therefore, with the VoCSM according to this embodiment, the maximum value Imax of current-value variations for the write current in the conductive layer can be kept 2×Ip or lower.

An example of the operation of the VoCSM according to this embodiment will be described with reference to FIGS. 30 and 31.

Figure 30:
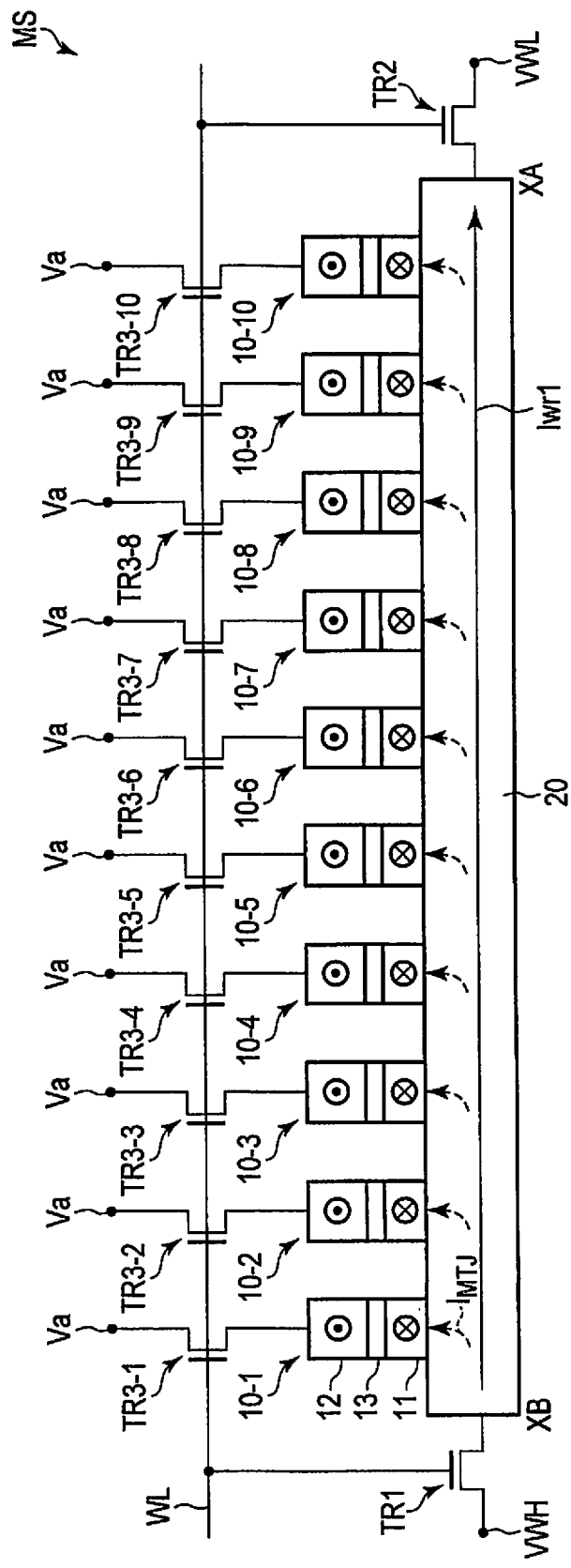

FIGS. 30 and 31 are schematic views for explaining an example of the operation of a magnetic memory according to this embodiment.

As shown in FIG. 30, the MTJ elements 10 within the selected memory cell string MS are all set to a selected state by the MTJ voltage VCNT of a negative voltage value Va. In the conductive layer 20, a write current Iwr1 is supplied.

All the MTJ elements 10 in the selected memory cell string MS are thereby set to the AP state.

Subsequently, in order to turn the magnetization alignment state of the MTJ elements 10 from the AP state to the P state, a write current Iwr2 is supplied in the conductive layer 20 in such a manner as to flow from the XA end side (high potential side) to the XB end side (low potential side) of the conductive layer 20.

As shown in FIG. 31, among the MTJ elements 10 in the memory cell string MS, the MTJ elements intended for the P-state setting are set to a selected state.

Here, the non-selection voltage Vd is applied to the MTJ elements to be maintained in the AP state, among the MTJ elements. The selection voltage Va is applied to the MTJ elements, of which magnetization state will be turned from the AP state to the P state, among the MTJ elements.

For example, a constant current source 149 is provided for connection to the low-potential side terminal of the conductive layer 20 (in this example, the XB end). The constant current source 149 outputs a current Iy to the ground terminal. This allows the write current Iwr flowing within the conductive layer 20 to have a further stabilized current value. The constant current source 149 is, for example, disposed in the write circuit 140.

The current flowing through the MTJ elements 10 has a current value Ip corresponding to the resistance value of the P-state MTJ element or a current value Iap corresponding to the resistance value of the AP-state MTJ element.

Since the voltage VCNT of the negative voltage value Va is applied to the selected MTJ elements 10, the MTJ current $I_{MTJ}$ for the selected MTJ elements flows from the conductive layer 20 to the MTJ elements 10. In a portion of the conductive layer corresponding to the selected MTJ element 10, the current value of the write current Iwr at the portion decreases by the current value Ip.

At this time, the MTJ elements 10 applied with the voltage Va are in the AP state or the P state according to the magnetization switching conditions (timing). As such, the current value of the MTJ current $I_{MTJ}$ for the selected MTJ elements 10 changes depending on the timing of magnetization switching from the AP state to the P state.

Since the voltage VCNT of the positive voltage value Vd is applied to the unselected MTJ elements 10, the MTJ current $I_{MTJ}$ for the unselected MTJ elements flows from the MTJ elements 10 to the conductive layer 20. The unselected MTJ elements are MTJ elements to be maintained in the AP state. Accordingly, the MTJ current $I_{MTJ}$ for the unselected MTJ elements has the current value Iap. In a portion of the conductive layer corresponding to the unselected MTJ element 10, the current value of the write current Iwr at the portion increases by the current value Iap.

For example, assuming that the MTJ current $I_{MTJ}$ (Ia, Id) has a substantially constant current value in the selected or the unselected MTJ elements, the number of 10-bit data codes that are capable of keeping the maximum value (Imax) of variations of the write current 1.5×$I_{MTJ}$ or lower is 404.

Therefore, in the conversion table for converting 8-bit data into 10-bit data according to this embodiment, 10-bit data codes can be assigned for a to-be-written 8-bit data code in consideration of the current-value variations of the write current which are due to the current flowing between the MTJ element and the conductive layer, and in such a manner as to reduce these variations.

For example, in order to stabilize the output current Iy, the constant current source 149 operates (effectuates) so that the current value for the portions of the conductive layer 20 that correspond to the selected MTJ elements 10 will decrease, and so that the current value for the portions of the conductive layer 20 that correspond to the unselected MTJ elements 10 will increase.

With this configuration, the VoCSM according to this embodiment can further suppress the variations of the current value of the write current Iwr in the conductive layer 20.

In this manner, with the MRAM according to the embodiment, the maximum value of variations of the write current Iwr in the conductive layer 20 can be kept $1.5 \times I_{MTJ}$ or lower.

For example, in accordance with the MR ratio of the MTJ element 10, a current flowing through the P-state MTJ element has a higher current value than a current flowing through the AP-state MTJ element. Thus, the purpose would be served if the maximum value Imax of variations of the write current Iwr in the conductive layer 20 can tolerate 1.5×Ip.

FIG. 32 is a graph for explaining the effects of the magnetic memory according to this embodiment.

In FIG. 32, the horizontal axis of the graph represents the MR ratio of the magnetoresistive effect element. Also in FIG. 32, the vertical axis of the graph represents the maximum value (normalized value) of variations of the write current. Each maximum value of variations of the write current is given as a normalized value (Imax/Ip) using the current value Ip. The maximum value takes an absolute value.

FIG. 32 shows a line A1 indicative of the relationship between the MR ratio of the magnetoresistive effect element and the value "Imax/Ip" in the case of using the conversion data that takes into account the tolerable value of variations of the write current.

Also, the figure shows a line A3 for the comparative example. The line A3 gives the maximum value of variations of the write current in the case of a known magnetic memory (for example, a magnetic memory using the general spin Hall effect and voltage effect).

As shown by the line A1 of FIG. 32, the VoCSM according to this embodiment can reduce the maximum value of variations of the write current as compared to the known magnetic memory shown by the line A3.

For example, with the VoCSM according to the embodiment, the value of variations of the write current Iwr, given as Imax/Ip, can be kept within the range of 0.5 to 2 (0.5<Imax/Ip≤2).

From the foregoing, the fifth embodiment can improve the memory characteristics of magnetic memories.

(6) Others

In this embodiment, the in-plane magnetization type MTJ element is used for the magnetoresistive effect element as the memory element. However, a perpendicular magnetization type MTJ element may be used for the memory element in the magnetic memory according to this embodiment.

The configuration and operation according to this embodiment may be applied to a memory device other than the magnetic memory (for example, the VoCSM and MRAM).

For example, the configuration and operation according to this embodiment may be applied to a memory device such as an ReRAM, PCRAM, and ion memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
a memory area;
a first memory unit disposed in the memory area and including h first magnetoresistive effect elements arrayed on a first conductive layer;
a first circuit configured to receive i-bit first data, convert the first data into j-bit (j=h) second data, and write the second data in the first memory unit;
a second memory unit disposed in the memory area and including h second magnetoresistive effect elements arrayed on a second conductive layer; and
a second circuit configured to select one of the first memory unit and the second memory unit as a read target based on an address, and generate a reference value for reading third data from the read target using the other one of the first memory unit and the second memory unit,
wherein the second data includes m first values and (j−m) second values, and
m and j have a relationship given by $$j/2 - 1 \leq m \leq j/2 + 1.$$

2. The memory of claim 1, further comprising:
a first area arranged in the memory area and including the first memory unit;
a second area arranged in the memory area and including the second memory unit;
a first word line arranged in the first area and connected to the first memory unit; and
a second word line arranged in the second area and connected to the second memory unit,
wherein
an address value indicating the first area is different from an address value indicating the second area, and
an address value indicating the first word line is the same as an address value indicating the second word line.

3. The memory of claim 2, wherein
the second circuit includes h sense amplifier units and h selectors,
each of the h sense amplifier units includes a first terminal and a second terminal,
each of the h selectors includes a third terminal and a fourth terminal,
the first terminal is connected to the third terminal of a corresponding one of the selectors,
the second terminal is connected to the fourth terminal of a corresponding one of the selectors, and
the second terminals of the h sense amplifier units are connected to each other.

4. The memory of claim 3, wherein
based on the address, the selectors connect one of the first memory unit and the second memory unit to the first terminals of the sense amplifier units, and connect the other one of the first memory unit and the second memory unit to the second terminals of the sense amplifier units.

5. The memory of claim 2, wherein
the second circuit includes h sense amplifier units, h selectors, and a current mirror circuit, each of the h sense amplifier units includes a first terminal and a second terminal,
each of the h selectors includes a third terminal and a fourth terminal,
the current mirror circuit includes a fifth terminal and a sixth terminal,
the first terminal is connected to the third terminal of a corresponding one of the selectors,
the second terminal is connected to the fifth terminal,
the sixth terminal is connected to the fourth terminal.

6. The memory of claim 5, wherein
based on the address, the selectors connect one of the first memory unit and the second memory unit to the first terminals of the sense amplifier units, and connect the other one of the first memory unit and the second memory unit to the current mirror circuit.

7. The memory of claim 2, wherein
the second circuit is arranged between the first area and the second area.

8. The memory of claim 1, wherein
the second circuit converts the j-bit third data into i-bit fourth data, and externally transmits the fourth data.

9. The memory of claim 1, wherein
each of the first magnetoresistive effect elements includes a first magnetic layer whose magnetization direction is variable, a second magnetic layer whose magnetization direction is in a fixed state, and a non-magnetic layer between the first magnetic layer and the second magnetic layer, and
the first magnetic layer is provided between the non-magnetic layer and the first conductive layer.

10. A memory system comprising:
a magnetic memory including a memory area, a first memory unit disposed in the memory area and including h first magnetoresistive effect elements arrayed on a first conductive layer, a second memory unit disposed in the memory area and including h second magnetoresistive effect elements arrayed on a second conductive layer, a first circuit configured to receive i-bit first data, convert the first data into j-bit (j=h) second data, and write the second data in the first memory unit, and a second circuit configured to select one of the first memory unit and the second memory unit as a read target based on an address, and generate a reference value for reading third data from the read target using the other one of the first memory unit and the second memory unit; and
a device configured to transmit the first data to the magnetic memory,
wherein the second data includes m first values and (j−m) second values, and
m and j have a relationship given by $j/2-1 \leq m \leq j/2+1$.

11. The system of claim 10, wherein
the magnetic memory further includes:
a first area arranged in the memory area and including the first memory unit;
a second area arranged in the memory area and including the second memory unit;
a first word line arranged in the first area and connected to the first memory unit; and
a second word line arranged in the second area and connected to the second memory unit,
wherein
an address value indicating the first area is different from an address value indicating the second area, and
an address value indicating the first word line is the same as an address value indicating the second word line.

12. The system of claim 11, wherein
the second circuit includes h sense amplifier units and h selectors,
each of the h sense amplifier units includes a first terminal and a second terminal,
each of the h selectors includes a third terminal and a fourth terminal,
the first terminal is connected to the third terminal of a corresponding one of the selectors,
the second terminal is connected to the fourth terminal of a corresponding one of the selectors, and
the second terminals of the h sense amplifier units are connected to each other.

13. The system of claim 12, wherein
based on the address, the selectors connect one of the first memory unit and the second memory unit to the first terminals of the sense amplifier units, and connect the other one of the first memory unit and the second memory unit to the second terminals of the sense amplifier units.

14. The system of claim 11, wherein
the second circuit includes h sense amplifier units, h selectors, and a current mirror circuit,
each of the h sense amplifier units includes a first terminal and a second terminal,
each of the h selectors includes a third terminal and a fourth terminal,
the current mirror circuit includes a fifth terminal and a sixth terminal,
the first terminal is connected to the third terminal of a corresponding one of the selectors,
the second terminal is connected to the fifth terminal,
the sixth terminal is connected to the fourth terminal.

15. The system of claim 14, wherein
based on the address, the selectors connect one of the first memory unit and the second memory unit to the first terminals of the sense amplifier units, and connect the other one of the first memory unit and the second memory unit to the current mirror circuit.

16. The system of claim 11, wherein
the second circuit is arranged between the first area and the second area.

17. The system of claim 10, wherein
the second circuit converts the j-bit third data into i-bit fourth data, and externally transmits the fourth data.

18. The system of claim 10, wherein
each of the first magnetoresistive effect elements includes a first magnetic layer whose magnetization direction is variable, a second magnetic layer whose magnetization direction is in a fixed state, and a non-magnetic layer between the first magnetic layer and the second magnetic layer, and
the first magnetic layer is provided between the non-magnetic layer and the first conductive layer.

* * * * *